(12) United States Patent
Chung et al.

(10) Patent No.: US 11,005,055 B2
(45) Date of Patent: May 11, 2021

(54) FLEXIBLE DISPLAY APPARATUS

(71) Applicant: SAMSUNG DISPLAY CO., LTD., Yongin-si (KR)

(72) Inventors: Horyun Chung, Suwon-si (KR); Sejoong Shin, Cheonan-si (KR); Jungsik Nam, Seoul (KR); Taekyoung Hwang, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 28 days.

(21) Appl. No.: 16/264,913

(22) Filed: Feb. 1, 2019

(65) Prior Publication Data

US 2019/0245157 A1    Aug. 8, 2019

(30) Foreign Application Priority Data

Feb. 2, 2018 (KR) ........................ 10-2018-0013608

(51) Int. Cl.
*H05K 1/00*     (2006.01)
*H01L 51/00*    (2006.01)
*H01L 27/32*    (2006.01)
*H01L 51/52*    (2006.01)
(Continued)

(52) U.S. Cl.
CPC ........ *H01L 51/0097* (2013.01); *G06F 1/1652* (2013.01); *H01L 27/3276* (2013.01); *H01L 51/5246* (2013.01); *H01L 51/5253* (2013.01); *H01L 51/56* (2013.01); *H01L 2227/323* (2013.01); *H01L 2251/5338* (2013.01); *H01L 2251/566* (2013.01)

(58) Field of Classification Search
CPC ............ H01L 51/0097; H01L 27/3276; H01L 51/5253; H01L 51/56; H01L 2227/323; H01L 2251/5338; H01L 2251/566; H01L 27/3258; H01L 51/5246; G09F 9/30; G09G 3/20; G09G 3/3208; G06F 1/1652; G06F 1/1641
See application file for complete search history.

(56) References Cited

U.S. PATENT DOCUMENTS 9,419,065 B2    8/2016  Degner et al.
9,748,520 B2    8/2017  Yi et al.
9,766,737 B2    9/2017  Ahn
(Continued)

FOREIGN PATENT DOCUMENTS

KR    10-2014-0011217    1/2014

*Primary Examiner* — Shouxiang Hu
(74) *Attorney, Agent, or Firm* — F. Chau & Associates, LLC

(57) ABSTRACT

A display apparatus may include a base substrate including a first portion and a second portion smaller than the first portion, a plurality of pixels disposed on the first portion, a protection substrate disposed below the base substrate, and a groove disposed in a portion of the protection substrate and overlapped with the second portion. The groove may include a first region extending in a first direction, and a second region and a third region, which are arranged along the first direction, wherein the first region is interposed between the second region and the third region. The first and second portions may be arranged in a second direction crossing the first direction, and a width of each of the second and third regions may be larger than a first width of the first region, when measured in the second direction.

20 Claims, 30 Drawing Sheets

(51) Int. Cl.
*H01L 51/56* (2006.01)
*G06F 1/16* (2006.01)

(56) References Cited

U.S. PATENT DOCUMENTS

| | | | |
|---|---|---|---|
| 10,020,462 B1 * | 7/2018 | Ai | H01L 51/524 |
| 10,211,416 B2 * | 2/2019 | Jin | H01L 33/44 |
| 10,342,133 B2 * | 7/2019 | Kawata | H05K 1/148 |
| 2014/0020844 A1 | 1/2014 | Woo et al. | |
| 2015/0146386 A1 * | 5/2015 | Namkung | H01L 51/0097 361/749 |
| 2016/0295685 A1 * | 10/2016 | Ryu | G06F 1/1652 |
| 2017/0042047 A1 | 2/2017 | Oh | |

\* cited by examiner

FLEXIBLE DISPLAY APPARATUS

CROSS-REFERENCE TO RELATED APPLICATION

This U.S. non-provisional patent application claims priority under 35 U.S.C. § 119 to Korean Patent Application No. 10-2018-0013608, filed on Feb. 2, 2018, in the Korean Intellectual Property Office, the disclosure of which is incorporated by reference herein in its entirety.

TECHNICAL FIELD

The present inventive concept relates to a display apparatus and a method of fabricating the same, and in particular, to a method of delaminating a protection substrate and a display apparatus fabricated thereby.

DISCUSSION OF RELATED ART

Various display apparatuses are being developed. One such display apparatus may include a flexible display panel, for example. Typically, the display panel includes a plurality of pixels, which are used to display an image, and a driving chip, which is used to control operations of the pixels. The pixels are provided in a display region of the display panel, and the driving chip is provided in a non-display region of the display panel. A bending region, which is located between the driving chip and the display region, can be bent to allow the driving chip to be located below the display panel.

A protection substrate is provided below the display panel to protect a lower portion of the display panel. A portion of the protection substrate may be removed from the bending region to reduce a thickness of the bending region. In this case, the bending region can be easily bent. When the bending region has a small width, delamination of the protection substrate in the bending region may not be easily performed. Furthermore, since the protection substrate in the bending region is removed, the border of the bending region may have a height difference. This border difference can lead to an increase of a strain and a stress to be exerted on the border when the bending region of the display panel is bent.

SUMMARY

According to an exemplary embodiment of the inventive concept, a display apparatus may include a base substrate including a first portion and a second portion smaller than the first portion, a plurality of pixels disposed on the first portion, a protection substrate disposed below the base substrate, and a groove disposed in a portion of the protection substrate and overlapped with the second portion. The groove may include a first region extending in a first direction, and a second region and a third region, which are arranged along the first direction, wherein the first region is interposed between the second region and the third region. The first and second portions may be arranged in a second direction crossing the first direction, and a width of each of the second and third regions may be larger than a first width of the first region, when measured in the second direction.

According to an exemplary embodiment of the inventive concept, a method of fabricating a display apparatus may include receiving a display panel including a base substrate with a first portion and a second portion, a protection substrate disposed below the base substrate, and a plurality of pixels disposed on the first portion, the second portion being smaller than the first portion and including a bending region extending in a first direction, irradiating an ultraviolet laser beam to a dummy region, which is a region of the protection substrate overlapped with the second portion, and irradiating a carbon dioxide laser beam to a border of the dummy region, delaminating the dummy region from the base substrate, and bending the bending region. The dummy region may include a first region extending in the first direction, and a second region and a third region, which are arranged along the first direction, wherein the first region is interposed between the second region and the third region. The bending region may be overlapped with the first region, may have a first width, and may be extended in the first direction. The first and second portions may be arranged in a second direction crossing the first direction, and a width of each of the second and third regions may be larger than a first width of the first region, when measured in the second direction.

According to an exemplary embodiment of the inventive concept, a display apparatus may include a base substrate including a first portion and a second portion smaller than the first portion, a plurality of pixels disposed on the first portion, a protection substrate disposed below the base substrate, and a groove disposed in a portion of the protection substrate and overlapped with the second portion. The groove may include a first region extending in a first direction and a second region extended from the first region in a second direction crossing the first direction. The second portion may include a bending region overlapped with the first region, and the first and second portions may be arranged in the second direction.

According to an exemplary embodiment of the inventive concept, a method of fabricating a display apparatus may include receiving a display panel including a base substrate with a first portion and a second portion, a protection substrate disposed below the base substrate, and a plurality of pixels disposed on the first portion, the second portion being smaller than the first portion and including a bending region extending in a first direction, irradiating a carbon dioxide laser beam to a border of a dummy region, which is a region of the protection substrate overlapped with the second portion, and irradiating an ultraviolet laser beam to the dummy region, delaminating the dummy region from the base substrate, and bending the bending region. The dummy region may include a first region extending in the first direction and a second region, which is extended from the first region in a second direction crossing the first direction. The first and second portions may be arranged in the second direction, and the bending region may be overlapped with the first region.

According to an exemplary embodiment of the inventive concept, a display apparatus includes: a base substrate having a bending region in a non-display area; a protection substrate disposed on the base substrate; a groove disposed in the bending region and having a bottom surface defined by the base substrate, wherein the protection substrate is separated by a first side of the groove and a second side of the groove, wherein the first and second sides of the groove are opposite each other, and wherein a width of a first area of the groove is greater than a width of a second area of the groove.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF THE EMBODIMENTS

Figure 1:
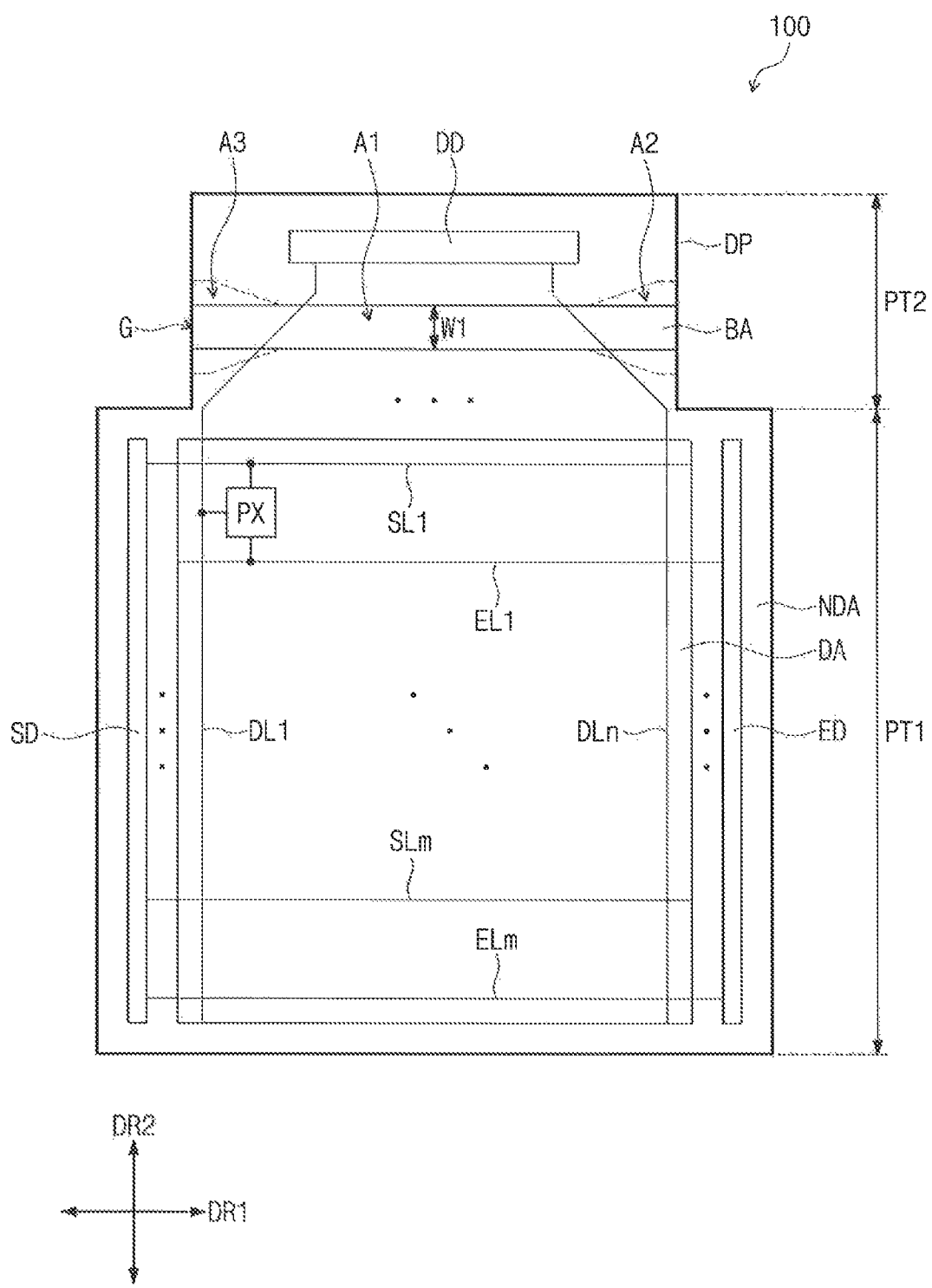
FIG. 1 is a plan view illustrating a display apparatus according to an exemplary embodiment of the inventive concept.

Exemplary embodiments of the inventive concept will now be described more fully with reference to the accompanying drawings. Exemplary embodiments of the inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus, their description may be omitted.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

Figure 2:
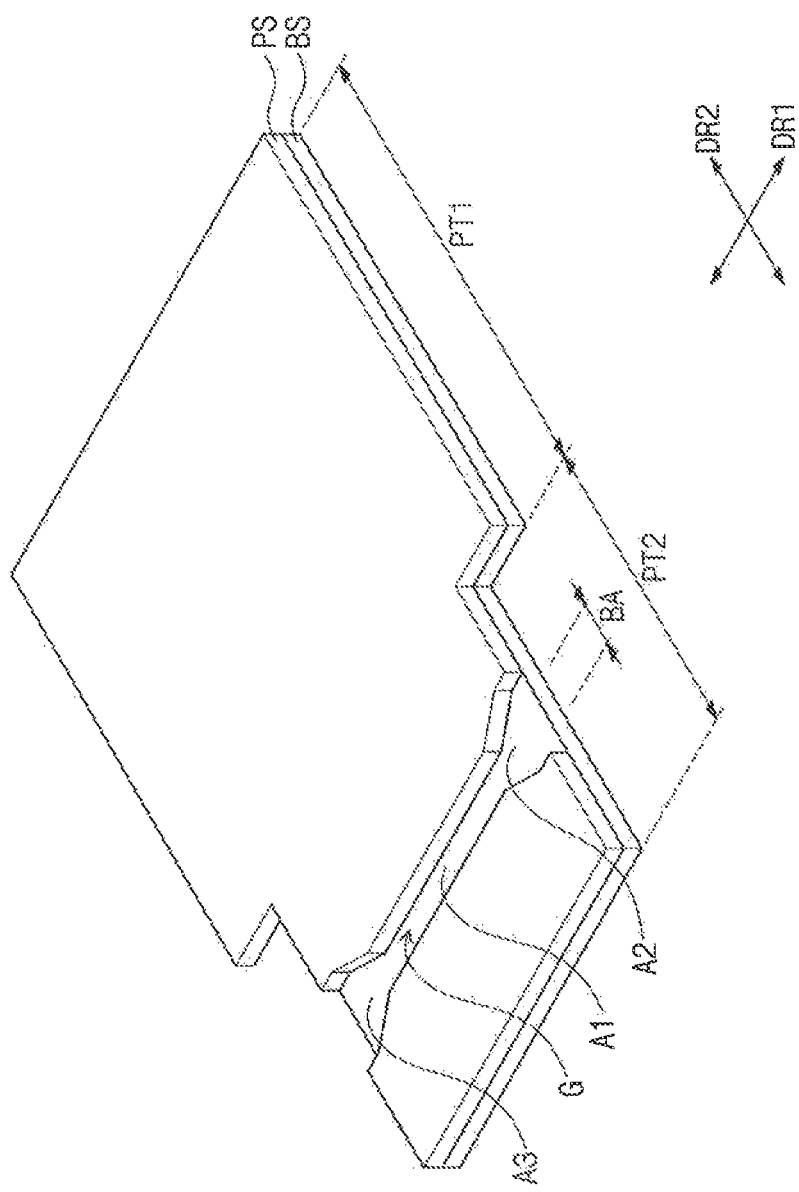
FIG. 2 is a perspective view illustrating a rear surface of a display panel of FIG. 1, according to an exemplary embodiment of the inventive concept.
Figure 3:
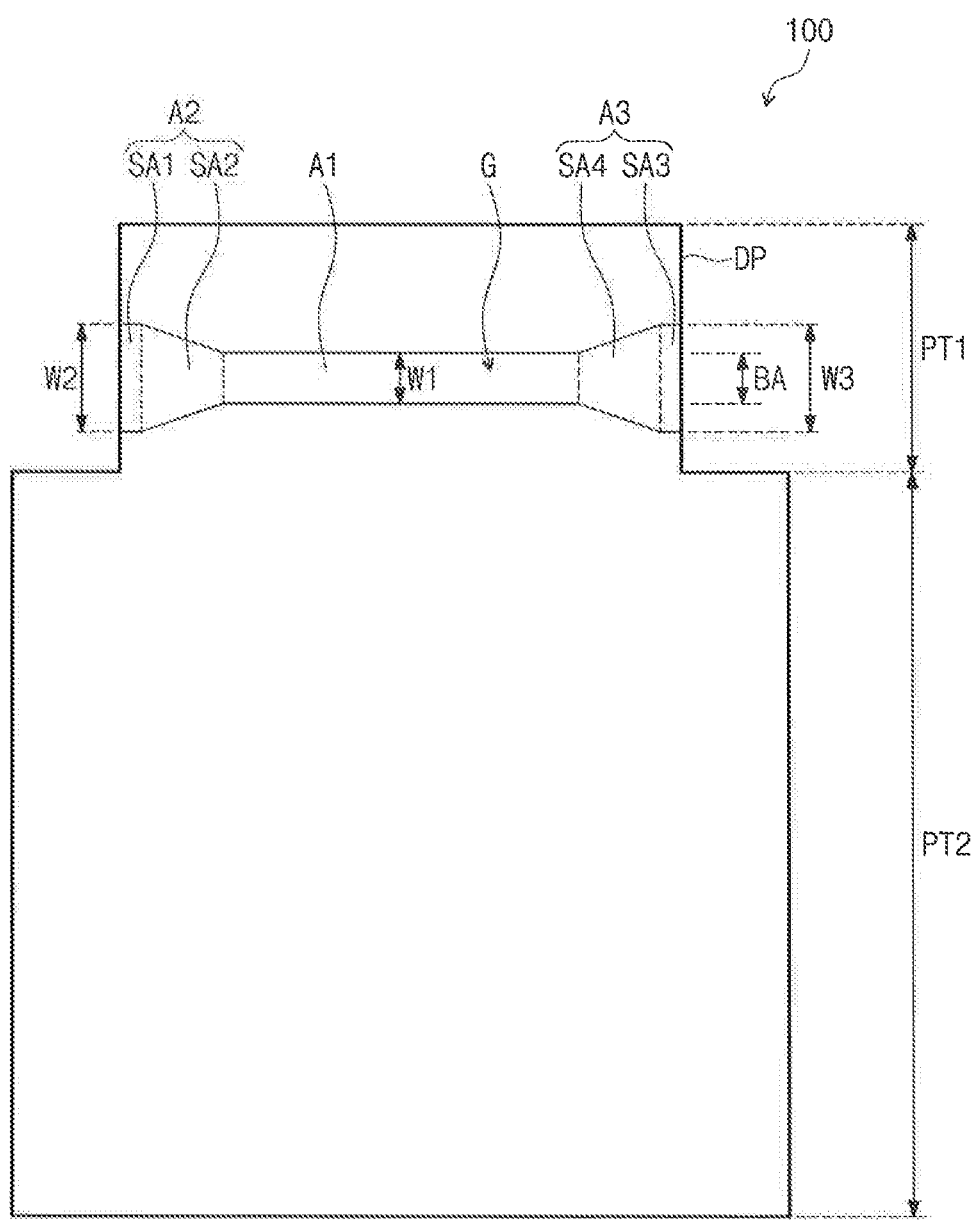
FIG. 3 is a bottom plan view illustrating regions of a groove of FIG. 2, according to an exemplary embodiment of the inventive concept.

FIG. 1 is a plan view illustrating a display apparatus according to an exemplary embodiment of the inventive concept. FIG. 2 is a perspective view illustrating a rear surface of a display panel of FIG. 1, according to an exemplary embodiment of the inventive concept. FIG. 3 is a bottom plan view illustrating regions of a groove of FIG. 2, according to an exemplary embodiment of the inventive concept.

Referring to FIG. 1, a display apparatus 100 may include a display panel DP, a scan driver SD, a data driver DD, and an emission driver ED. The scan driver SD, the data driver DD, and the emission driver ED may provide driving signals, which are used to control the display panel DP, to the display panel DP, and the display panel DP may produce an image in response to the driving signals.

The display panel DP may be an organic light emitting display panel including a plurality of organic light emitting devices, but the inventive concept is not limited thereto. For example, in an exemplary embodiment of the inventive concept, one of various image displaying panels such as a liquid crystal display panel, an electrowetting display panel, and an electrophoresis display panel may be used as the display panel DP. The display panel DP may be a flexible display panel. For example, the display panel DP may include a substrate, which is formed of a flexible plastic material, and a plurality of electronic devices, which are provided on the substrate.

The display panel DP may include a first portion PT1 and a second portion PT2 smaller than the first portion PT1. The second portion PT2 may include a bending region (or bending area) BA extending in a first direction DR1. The first portion PT1 and the second portion PT2 may be arranged in a second direction DR2 crossing the first direction DR1. In an exemplary embodiment of the inventive concept, the first and second portions PT1 and PT2 of the display panel DP may differ from each other in size, but the inventive concept is not limited thereto. For example, the display panel DP may have a rectangular shape and, in this case, each of the first and second portions PT1 and PT2 may have the same length in the first direction DR1.

The first portion PT1 may include a display region DA and a non-display region NDA surrounding the display region DA. The display region DA may be used to display an image, and the non-display region NDA may not be used to display an image. The second portion PT2 may not be used to display an image. The regions, which are not used to display an image, may include a bezel region.

The display panel DP may include a plurality of pixels PX, a plurality of scan lines SL1-SLm, a plurality of data lines DL1-DLn, and a plurality of emission lines EL1-Elm, where m and n are natural numbers. For convenience in illustration, one pixel PX is illustrated in FIG. 1. The pixels PX may be image-displaying devices. Each of the pixels PX may include an organic light emitting device, which is used to display an image, and transistors, which are used to control the organic light emitting device. The pixels PX may be provided in the display region DA and may be connected to the scan lines SL1-SLm, the data lines DL1-DLn, and the emission lines EL1-ELm.

The scan driver SD and the emission driver ED may be provided on the non-display region NDA. The scan driver SD and the emission driver ED may be provided at two opposite regions of the non-display region NDA. For example, the scan driver SD may be placed at a first region of the non-display region NDA and the emission driver ED may be placed at a second region of the non-display region NDA. The first and second regions of the non-display region NDA may be spaced apart from each other with the display region DA interposed therebetween. For example, the scan driver SD may be provided in the first region of the non-display region NDA, which is located adjacent to one of long sides of the display panel DP. The emission driver ED may be provided in the second region of the non-display region NDA, which is located adjacent to an opposite one of the long sides of the display panel DP.

The data driver DD may be provided on the second portion PT2. The data driver DD may be an integrated circuit chip mounted on the second portion PT2. The bending region BA may be provided between the data driver DD and the first portion PT1.

The scan lines SL1-SLm may be extended in the first direction DR1 to be connected to the scan driver SD and may receive scan signals from the scan driver SD. The data lines DL1-DLn may be extended in the second direction DR2 to be connected to the data driver DD and may receive data voltages from the data driver DD. The emission lines EL1-Elm may be extended in the first direction DR1 to be connected to the emission driver ED and may receive emission signals from the emission driver ED.

The scan driver SD may generate a plurality of scan signals, which will be applied to the pixels PX through the scan lines SL1-SLm. The scan signals may be sequentially applied to the pixels PX. The data driver DD may generate a plurality of data voltages, which will be applied to the pixels PX through the data lines DL1-DLn. The emission driver ED may generate a plurality of emission signals, which will be applied to the pixels PX through the emission lines EL1-ELm.

The display apparatus 100 may include a timing controller, which is used to control the scan driver SD, the data driver DD, and the emission driver ED. The timing controller may generate scan control signals, data control signals, and emission control signals in response to control signals received from the outside. In addition, the timing controller may receive image signals from the outside, convert the image signals to a data format suitable for interface specifications with the data driver DD, and provide the converted data to the data driver DD.

The scan driver SD may generate the scan signals in response to the scan control signals, and the emission driver ED may generate the emission signals in response to the emission control signals. The data driver DD may receive the image signals of the converted data format, and then, generate data voltages corresponding to the image signals, in response to the data control signals.

The pixels PX may receive data voltages in response to the scan signals. The pixels PX may emit light, which has a brightness level corresponding to the data voltage, in response to the emission signals, and display an image. A light-emitting time of a pixel PX may be controlled by an emission signal provided from the emission driver ED.

The display panel DP may be provided to have a groove G formed in a rear surface thereof. The groove G may include a first region A1, a second region A2, and a third region A3. The second and third regions A2 and A3 may be spaced apart from each other with the first region A1 interposed therebetween. A shape of the groove G will be described in more detail with reference to FIGS. 2 and 3.

Referring to FIGS. 2 and 3, the display panel DP may include a base substrate BS and a protection substrate PS, which is provided on the base substrate BS. Since a rear surface of the display panel DP is illustrated in FIG. 2, a surface of the base substrate BS illustrated in FIG. 2 may be the rear surface of the base substrate BS. The protection substrate PS may be provided on the rear surface of the base substrate BS. Similar to the display panel DP, the base substrate BS may include the first portion PT1 and the second portion PT2, and the second portion PT2 of the base substrate BS may include the bending region BA.

The groove G may be formed by removing a portion of the protection substrate PS, which is overlapped with the second portion PT2. In other words, the groove G may be formed by removing a portion of the protection substrate PS in the bending region BA. The groove G may include the first region A1, the second region A2, and the third region A3. The first region A1, the second region A2, and the third region A3 may be arranged in the first direction DR1. The first region A1 may be extended in the first direction DR1 and may be provided between the second region A2 and the third region A3. When measured in the second direction DR2, a width of each of the second and third regions A2 and A3 may be larger than a first width W1 of the first region A1.

The bending region BA may be overlapped with the first region A1, may have the first width W1, and may be extended in the first direction DR. The bending region BA extending in the first direction DR1 may be overlapped with a region of each of the second and third regions A2 and A3.

In an exemplary embodiment of the inventive concept, the second and third regions A2 and A3 may have substantially the same size and may have symmetric shapes, as shown in FIGS. 2 and 3. However, the inventive concept is not limited thereto, and for example, the second and third regions A2 and A3 may have sizes different from each other and may not be symmetric to each other.

The second region A2 may include a first sub-region SA1 and a second sub-region SA2, which is provided between the first region A1 and the first sub-region SA1. The third region A3 may include a third sub-region SA3 and a fourth sub-region SA4, which is provided between the first region A1 and the third sub-region SA3. Each of the first and third sub-regions SA1 and SA3 may have a rectangular shape.

When measured in the second direction DR2, the first sub-region SA1 may have a second width W2 larger than the first width W1. When measured in the second direction DR2, the third sub-region SA3 may have a third width W3 larger than the first width W1. In an exemplary embodiment of the inventive concept, the second width W2 may be substantially equal to the third width W3, as shown in FIGS. 2 and 3. However, the inventive concept is not limited thereto, and for example, the second width W2 may be different from the third width W3.

A width of the second sub-region SA2 may gradually decrease from the second width W2 to the first width W1 in a direction extending from the first sub-region SA1 to the first region A1. However, the inventive concept is not limited thereto, and for example, the second sub-region SA2 may have substantially the same width (e.g., the second width W2) as the first sub-region SA1.

A width of the fourth sub-region SA4 may gradually decrease from the third width W3 to the first width W1 in a direction extending from the third sub-region SA3 to the first region A1. However, the inventive concept is not limited thereto, and for example, the fourth sub-region SA4 may have substantially the same width (e.g., the third width W3) as the third sub-region SA3.

The bending region BA may be bent in such a way that a portion of the second portion PT2 (e.g., located above the bending region BA in a plan view) is disposed below the first portion PT1. Accordingly, when the bending region BA is bent, the data driver DD may be disposed below the first portion PT1. This will be described in more detail below.

Figure 4:
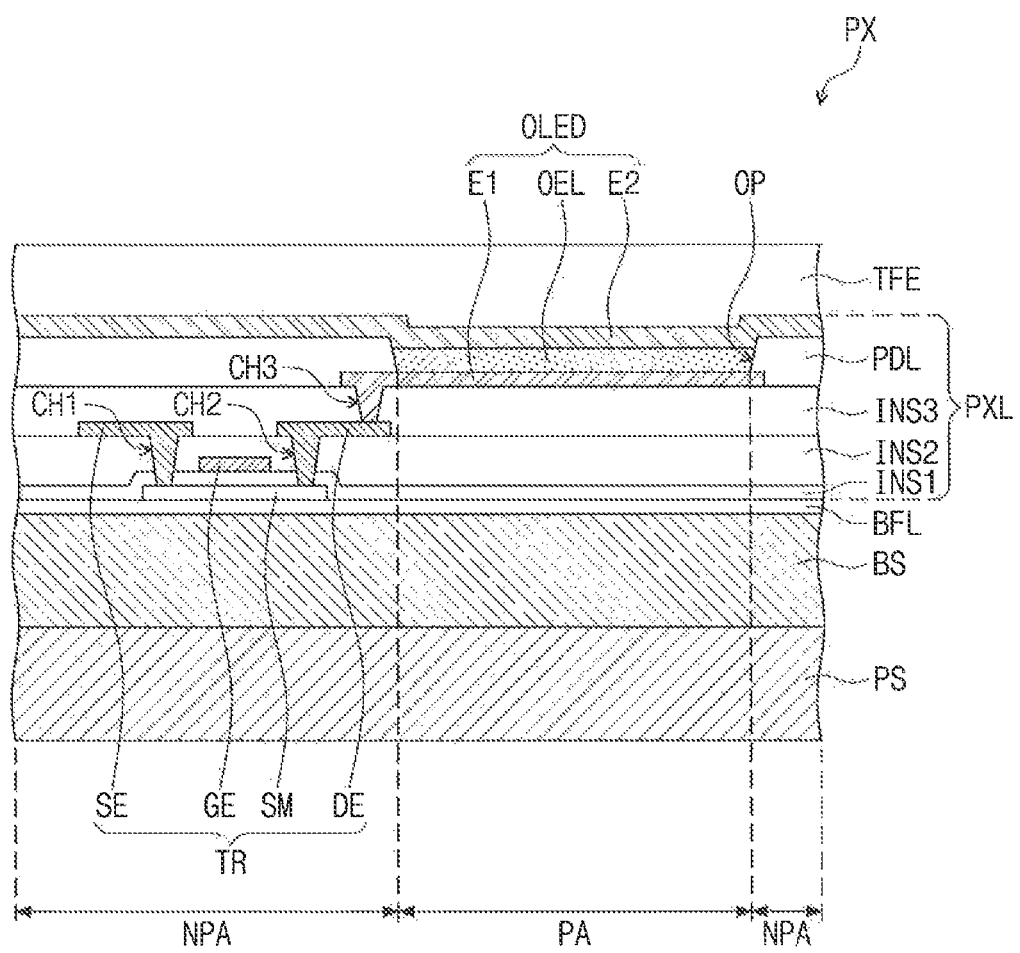
FIG. 4 is a sectional view illustrating a region of a display panel including a pixel of FIG. 1, according to an exemplary embodiment of the inventive concept.

FIG. 4 is a sectional view illustrating a region of a display panel including a pixel PX of FIG. 1, according to an exemplary embodiment of the inventive concept.

Referring to FIG. 4, the pixel PX may include an organic light emitting device OLED and a transistor TR connected to the organic light emitting device OLED. The transistor TR and the organic light emitting device OLED may be provided on the base substrate BS. A layer provided with the transistor TR and the organic light emitting device OLED may be a pixel layer PXL.

The base substrate BS may be a transparent flexible substrate that is formed of a flexible plastic material. For example, the flexible plastic material of the base substrate BS may include polyimide (PI). A buffer layer BFL may be provided on the base substrate BS and may be formed of or include an inorganic material. The protection substrate PS, which is formed of a flexible plastic material, may be provided below the base substrate BS. The flexible plastic material of the protection substrate PS may include polyimide (PI) or polyethylene terephthalate (PET).

The transistor TR may include a semiconductor layer SM provided on the buffer layer BFL. The semiconductor layer SM may be formed of or include an inorganic semiconductor material (e.g., amorphous silicon or poly silicon) or an organic semiconductor material. In addition, the semiconductor layer SM may be formed of or include an oxide semiconductor material. The semiconductor layer SM may include a source region, a drain region, and a channel region between the source region and the drain region.

A first insulating layer INS1 may be provided on the buffer layer BFL to cover the semiconductor layer SM. The first insulating layer INS1 may be formed of or include an inorganic material. The transistor TR may include a gate electrode GE, which is provided on the first insulating layer INS1 and is overlapped with the semiconductor layer SM. The gate electrode GE may be overlapped with the channel region of the semiconductor layer SM.

A second insulating layer INS2 may be provided on the first insulating layer INS to cover the gate electrode GE. The second insulating layer INS2 may be an interlayer insulating layer. The second insulating layer INS2 may be formed of or include an organic material and/or an inorganic material.

The transistor TR may include a source electrode SE and a drain electrode DE, which are provided on the second insulating layer INS2 and are spaced apart from each other. The source electrode SE may be connected to the source region of the semiconductor layer SM through a first contact hole CH1, which penetrates the first insulating layer INS1 and the second insulating layer INS2. The drain electrode DE may be connected to the drain region of the semiconductor layer SM through a second contact hole CH2, which penetrates the first insulating layer INS1 and the second insulating layer INS2.

A third insulating layer INS3 may be provided on the second insulating layer INS2 to cover the source electrode SE and the drain electrode DE of the transistor TR. The third insulating layer INS3 may be a planarization layer for providing a flat top surface and may be formed of or include an organic material.

A first electrode E1 of the organic light emitting device OLED may be provided on the third insulating layer INS3. The first electrode E1 may be connected to the drain electrode DE of the transistor TR through a third contact hole CH3, which penetrates the third insulating layer INS3. The first electrode E1 may be a pixel electrode or an anode electrode. The first electrode E1 may be formed of or include a transparent material or a reflective material.

A pixel definition layer PDL may be provided on the first electrode E1 and the third insulating layer INS3 to expose a portion of the first electrode E1. An opening OP may be formed in the pixel definition layer PDL to expose the portion of the first electrode E1. A region of the pixel definition layer PDL provided with the opening OP may be a pixel region PA. A region around the pixel region PA may be a non-pixel region NPA. For example, the regions to the left and right of the pixel region PA in FIG. 4 may be non-pixel regions NPA.

An organic light emitting layer OEL may be provided in the opening OP and on the first electrode E1. The organic light emitting layer OEL may be formed of or include an organic material capable of generating one of red, green, and blue lights. The organic light emitting layer OEL may generate one of red, green, and blue lights. However, the inventive concept is not limited thereto, and the organic light emitting layer OEL may be configured in such a way that organic materials capable of generating red, green, and blue lights are combined to generate a white light.

The organic light emitting layer OEL may be formed of or include a low molecular organic material or a polymer organic material. The organic light emitting layer OEL may have a multi-layered structure including a hole injection layer (HIL), a hole transporting layer (HTL), a light emitting layer (EML), an electron transporting layer (ETL), and an electron injection layer (EIL). The hole injection layer (HIL) may be provided on the first electrode E1, and the hole transporting layer (HTL), the light emitting layer (EML), the electron transporting layer (ETL), and the electron injection layer (EIL) may be sequentially stacked on the hole injection layer (HIL).

A second electrode E2 may be provided on the pixel definition layer PDL and the organic light emitting layer OEL. The second electrode E2 may be a common electrode or a cathode electrode. The second electrode E2 may be formed of or include a transparent material or a reflective material.

When the display panel DP is a top-emission type organic light emitting display panel, the first electrode E1 may be formed of a reflective material and the second electrode E2 may be formed of a transparent material. When the display panel DP is a bottom-emission type organic light emitting display panel, the first electrode E1 may be formed of a transparent material and the second electrode E2 may be formed of a reflective material.

The organic light emitting device OLED may be formed in the pixel region PA and may include the first electrode E1, the organic light emitting layer OEL, and the second electrode E2, which are provided in the pixel region PA. The first electrode E1 may be used as a hole injection electrode or a positive electrode, and the second electrode E2 may be used as an electron injection electrode or a negative electrode.

A thin encapsulation layer TFE may be provided on the organic light emitting device OLED to cover the pixel PX. For example, the thin encapsulation layer TFE may be provided on the second electrode E2. The thin encapsulation layer TFE may be formed of or include an organic material and/or an inorganic material.

A first voltage may be applied to the first electrode E1 through the transistor TR, and a second voltage having an opposite polarity to the first voltage may be applied to the second electrode E2. In this case, light may be emitted from the organic light emitting layer OEL of the organic light emitting device OLED. Holes and electrons, which are injected into the organic light emitting layer OEL, may be combined to form excitons, and light may be emitted from the organic light emitting device OLED when the excitons are transited to the ground state. The organic light emitting device OLED may emit a red, green, or blue light constituting an image.

Figure 5:
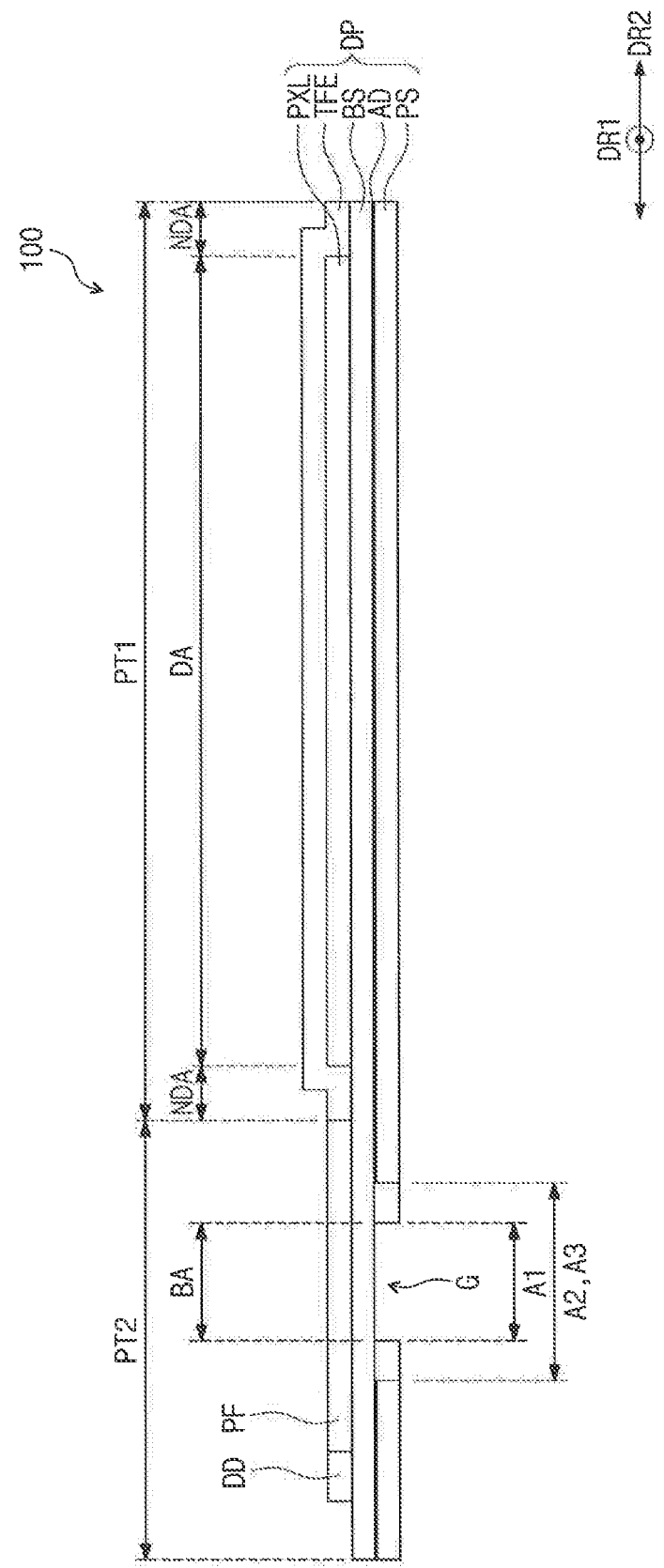
FIG. 5 is a side view of the display apparatus of FIG. 1 viewed from a first direction, according to an exemplary embodiment of the inventive concept.

FIG. 5 is a side view of the display apparatus of FIG. 1 viewed from a first direction, according to an exemplary embodiment of the inventive concept.

For convenience in illustration, the buffer layer BFL provided on the base substrate BS is not illustrated in FIG. 5.

Referring to FIG. 5, the display panel DP may include the base substrate BS, the pixel layer PXL, the thin encapsulation layer TFE, the protection substrate PS, and a protection film PF. The pixel layer PXL may be disposed on the display region DA of the base substrate BS, and the thin encapsulation layer TFE may be provided on the first portion PT1 of the base substrate BS to cover the pixel layer PXL. The data driver DD may be provided on the second portion PT2 of the base substrate BS.

The protection film PF may be provided on the base substrate BS and between the thin encapsulation layer TFE and the data driver DD. The protection film PF may be used to protect interconnection lines, which are disposed between the thin encapsulation layer TFE and the data driver DD.

The protection substrate PS may be provided below the base substrate BS. The protection substrate PS and the base substrate BS may have substantially the same thickness or different thicknesses. The rear surface of the display panel DP may be defined by the protection substrate PS. An adhesive member AD may be provided between the base substrate BS and the protection substrate PS. The protection substrate PS may be attached to the base substrate BS by the adhesive member AD.

The groove G may be formed by removing a portion of the protection substrate PS, which is overlapped with the second portion PT2. In other words, a portion of the protection substrate PS in the second portion PT2 of the display panel DP may be removed to form the groove G. Accordingly, the rear surface of the base substrate BS may be exposed by the groove G, on the bending region BA.

FIGS. 6 to 9 are diagrams illustrating a method of fabricating the display apparatus of FIG. 1, according to an exemplary embodiment of the inventive concept.

Figure 6:
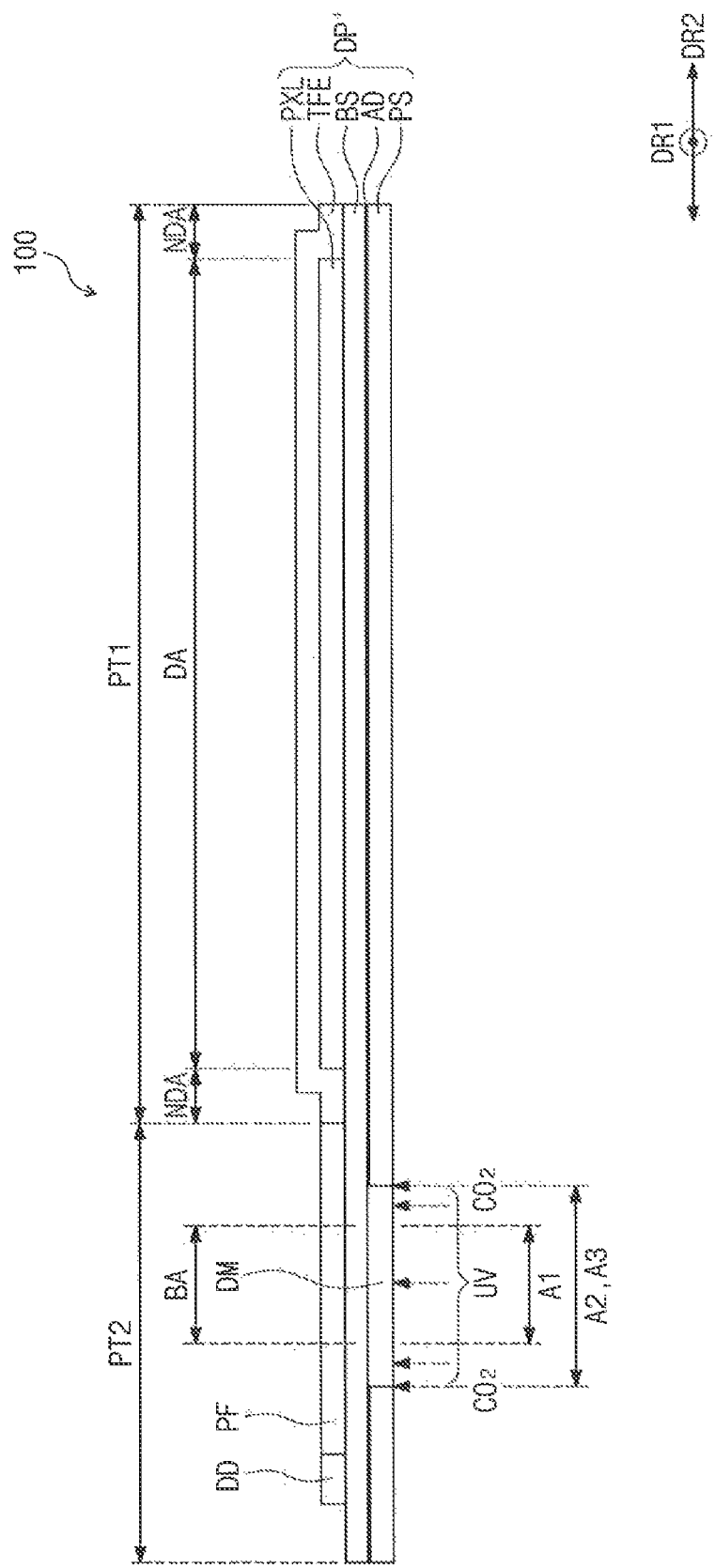
FIGS. 6, 7, 8 and 9 are diagrams illustrating a method of fabricating the display apparatus of FIG. 1, according to an exemplary embodiment of the inventive concept.

Referring to FIG. 6, a display panel DP' may be prepared, and in an exemplary embodiment of the inventive concept, the display panel DP' may be a panel, in which the groove G is not yet formed in the protection substrate PS. Thus, the protection substrate PS may be provided along the entirety of the rear surface of the base substrate BS. A region of the protection substrate PS to be overlapped with the groove G may be a dummy region DM. The dummy region DM may include the first region A1 and the second and third regions A2 and A3, which are spaced apart from each other with the first region A1 interposed therebetween.

A laser beam may be irradiated to the dummy region DM in an upward direction (indicated by the vertical arrows) from the bottom surface of the display panel DP'. The laser beam, which is used to fabricate the display apparatus 100, may include an ultraviolet laser beam UV and a carbon dioxide laser beam CO2. The ultraviolet laser beam UV may be irradiated to the dummy region DM in the upward direction from the bottom surface of the display panel DP'. The carbon dioxide laser beam CO2 may be irradiated to a border of the dummy region DM.

Figure 7:
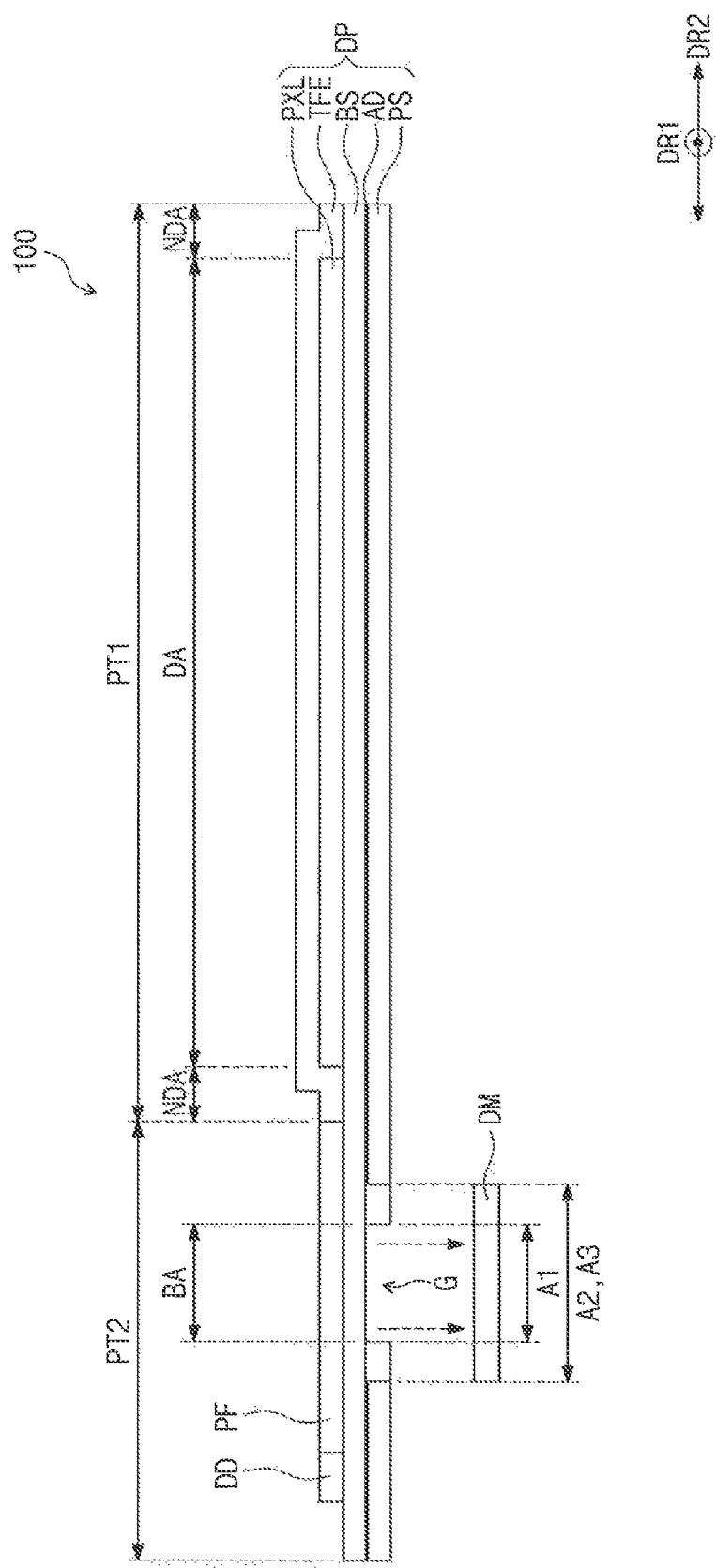
Figure 8:
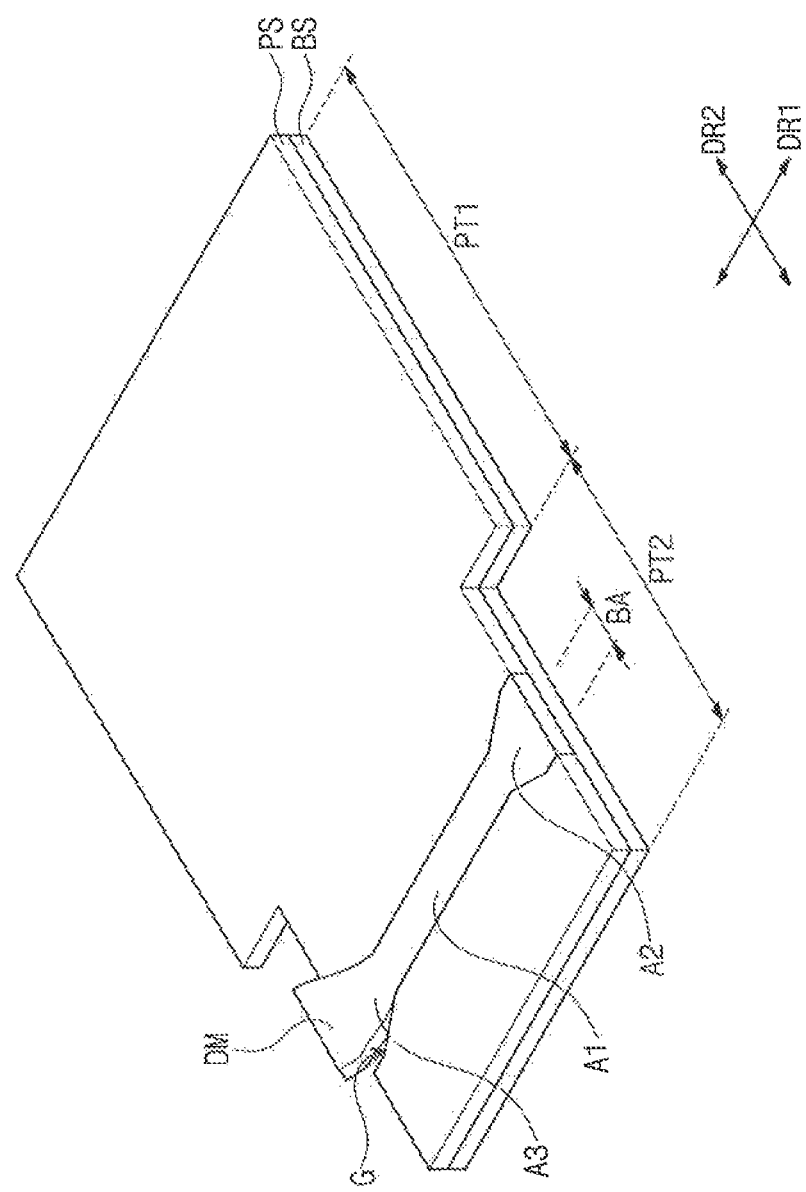

Referring to FIGS. 7 and 8, the border of the dummy region DM may be melted and cut by the carbon dioxide laser beam CO2. The ultraviolet laser beam UV may be used to weaken an adhesive strength in an area, which is located between the base substrate BS and the adhesive member AD and is overlapped with the dummy region DM. For example, when the ultraviolet laser beam UV is irradiated to the base substrate BS made of polyimide, hydrogen may be produced from the base substrate BS, thereby weakening the adhesion between the base substrate BS and the adhesive member AD near the dummy region DM.

Since the border of the dummy region DM is cut and an adhesive strength between the base substrate BS and the adhesive member AD is weakened near the dummy region DM, the dummy region DM may be delaminated from the base substrate BS. In other words, the dummy region DM may be removed from the base substrate BS. An additional delamination device may be used to detach the dummy region DM from the display panel DP'.

The delamination of the dummy region DM may start from one of opposite side regions of the dummy region DM. For example, the delamination of the dummy region DM may start from one of the second and third regions A2 and A3 of the dummy region DM. In more detail, the delamination of the dummy region DM may start from one of the first and third sub-regions SA and SA3 defining the opposite side regions of the dummy region DM. For example, as shown in FIG. 8, the delamination of the dummy region DM may start from the third region A3. More specifically, the dummy region DM may be removed from the third region A3 first.

The second and third widths W2 and W3 of the first and third sub-regions SA1 and SA3 may be larger than the first width W1 of the first region A1. Thus, it may be easy to grasp one of the opposite side regions of the dummy region DM using the delamination device, when the delamination of the dummy region DM is performed. For example, as shown in FIG. 8, the large side of the dummy region DM near the third region A3, which has separated from the base substrate BS, may be more easily held so that the rest of the dummy region DM can be peeled from the base substrate BS.

Figure 9:
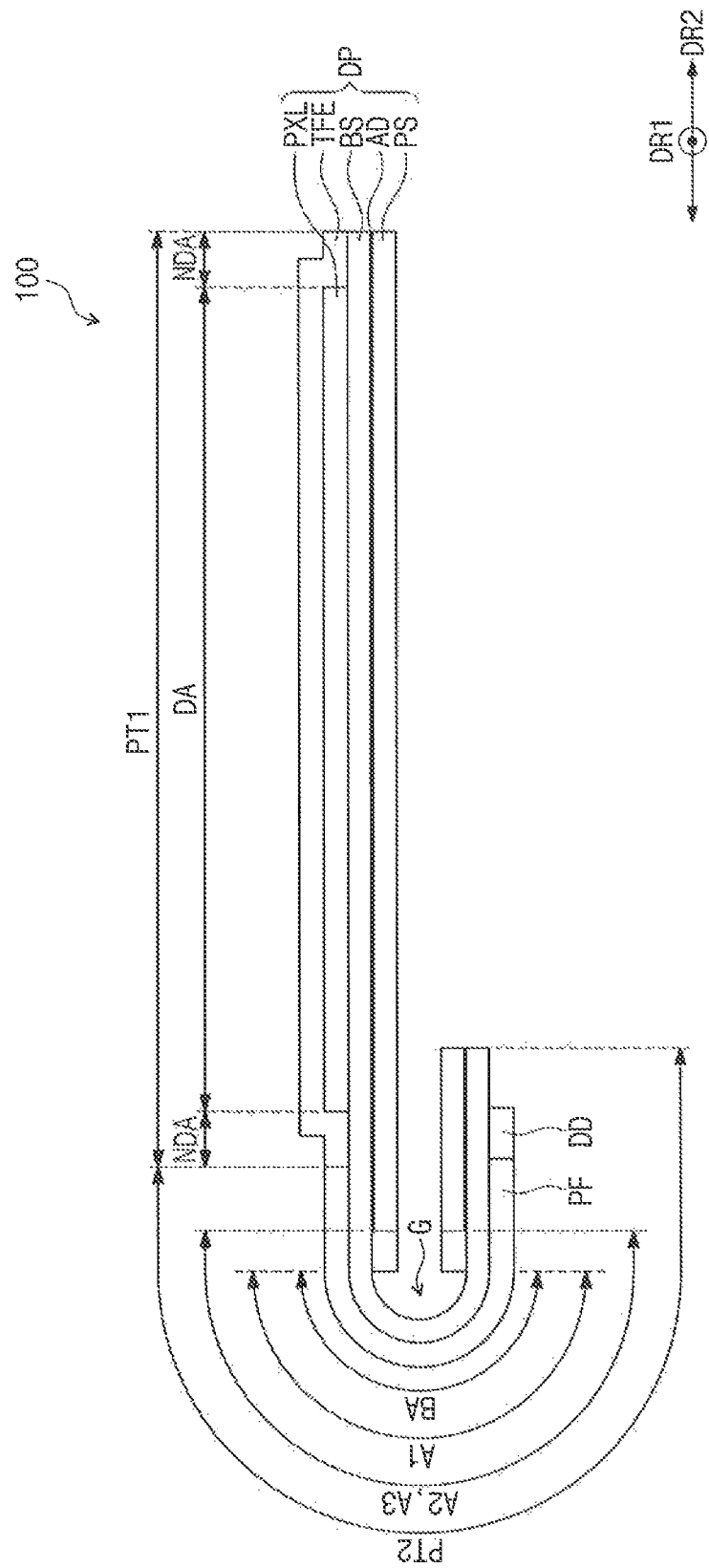

Referring to FIG. 9, since the dummy region DM is delaminated from the display panel DP, the groove G may be formed in the rear surface of the display panel DP. Since the bending region BA is overlapped with the groove G, the display panel DP may have a reduced thickness at the bending region BA. The reduction of the thickness of the bending region BA may allow for easy bending of the bending region BA. When the bending region BA is bent, the data driver DD may be placed below the first portion PT1.

As a result of the bending of the bending region BA, the data driver DD and a portion of the second portion PT2 adjacent to the data driver DD may be placed below the rear surface of the display panel DP. Thus, when the display apparatus 100 is viewed in a top-down plan view, a bezel region including the data driver DD and the second portion PT2 adjacent to the data driver DD may not be exposed to the outside. In other words, the data driver DD and the second portion PT2 adjacent to the data driver DD may not be viewed from above the display panel DP. Therefore, it is possible to reduce an area of the bezel region.

The groove G may be provided at a region, which does not include the second and third regions A2 and A3 and is overlapped with the bending region BA. Hereinafter, opposite side regions of the bending region BA may be referred to as regions of the bending region BA, which are respectively overlapped with the first and third sub-regions SA1 and SA3, when viewed in FIG. 1.

In the case where the groove G is provided in only a region overlapped with the bending region BA, curved and flat portions, which are located at the opposite side regions of the bending region BA, may have a height difference. For example, the border of the bending region BA may have a height difference at the opposite side regions of the bending region BA. Due to the height difference, a strain and a stress to be exerted on a border between the curved and flat portions of the display panel DP may be increased.

By contrast, in an exemplary embodiment of the inventive concept, each of the second and third regions A2 and A3 including the first and third sub-regions SA1 and SA3 may have a width that is larger than a width of the bending region BA. In this case, at the opposite side regions of the bending region BA, the border of the bending region BA may not have a height difference. Rather, the borders of the second and third regions A2 and A3 may have a height difference. The curved and flat portions of the display panel DP, which are located at the opposite side regions of the bending region BA, may have no height difference. As a result, it is possible to reduce a strain and a stress to be exerted on the border between the curved and flat portions of the display panel DP.

As a result, in the display apparatus 100 and a fabrication method thereof according to an exemplary embodiment of the inventive concept, a delamination operation can be more easily performed on the dummy region DM of the protection substrate PS. When this happens, a strain and a stress to be exerted on borders of the opposite side regions of the bending region BA can be relieved.

Hereinafter, display apparatuses according to alternative embodiments of the inventive concept will be described in more detail with reference to FIGS. 10 to 30. Except for a difference in shape of each of grooves G_1-G_14, each of display apparatuses 100_1-100_14 shown in FIGS. 10 to 30 may have substantially the same features as those of the display apparatus 100 shown in FIG. 1. Thus, the following description of the display apparatuses 100_1-100_14 will be focused on the grooves G_1-G_14. Elements that are substantially the same as those of the aforementioned elements will be identified by the same reference numbers. Furthermore, each of the grooves G_1-G_14 is illustrated in detail in FIGS. 10 to 30, for convenience in description.

Figure 10:
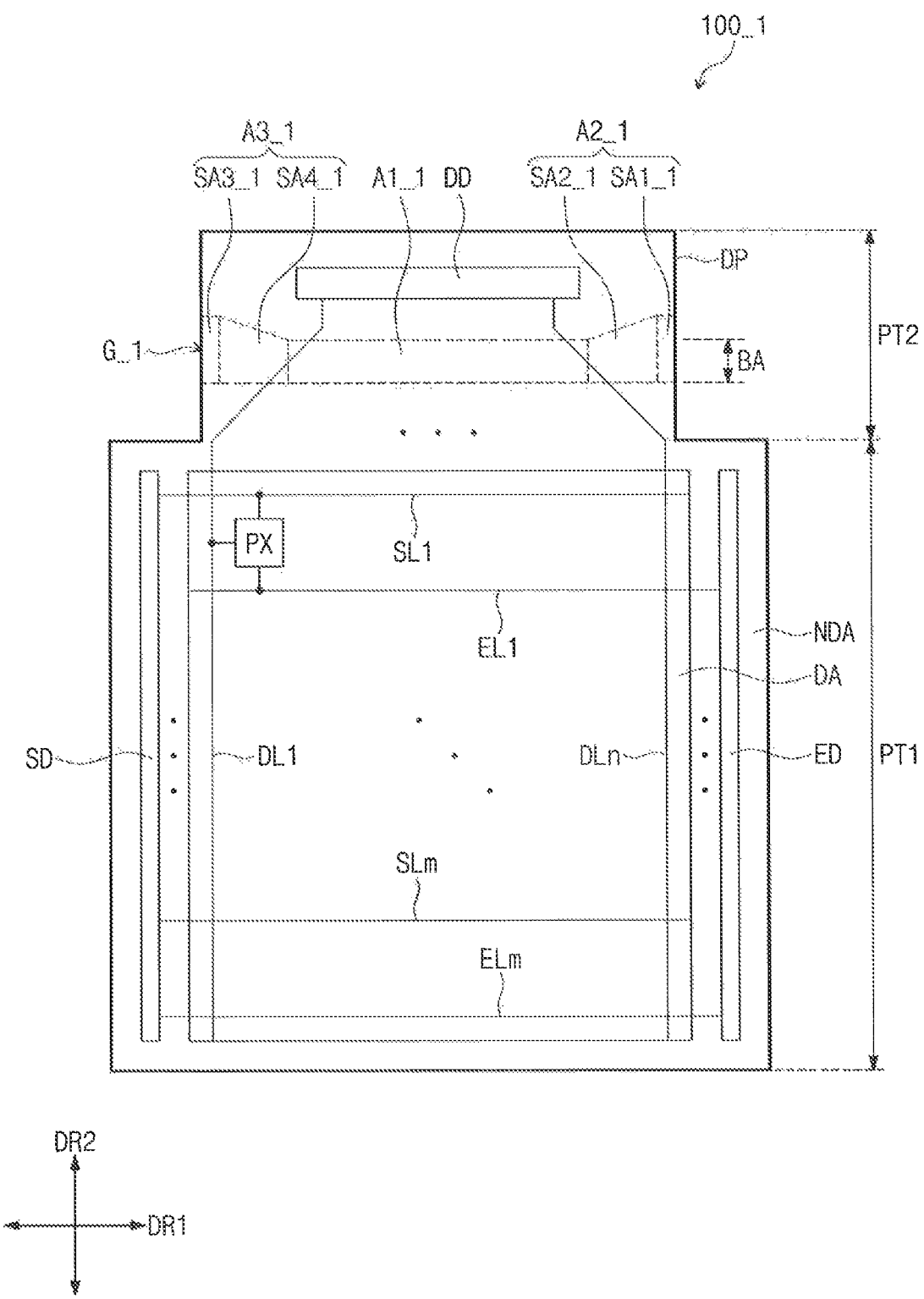
FIG. 10 is a plan view illustrating a display apparatus according to an exemplary embodiment of the inventive concept.
Figure 11:
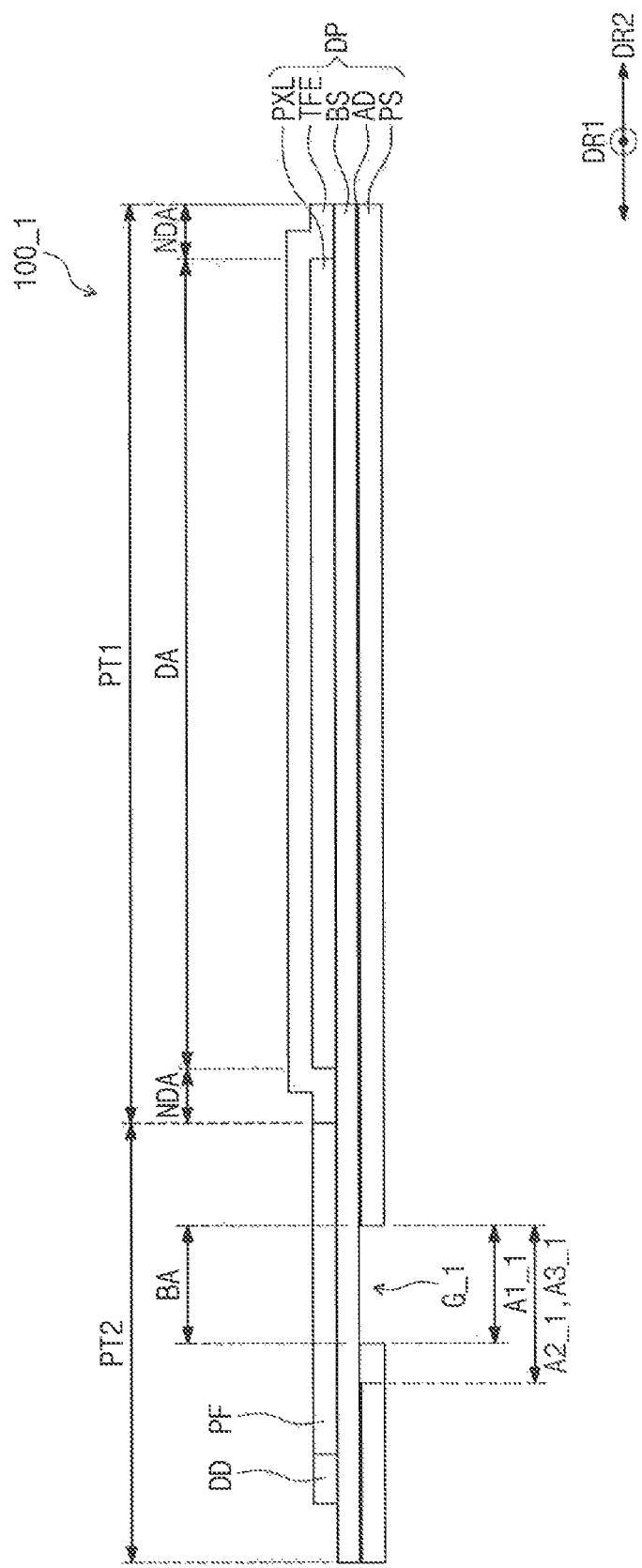
FIG. 11 is a side view of the display apparatus of FIG. 10 viewed from a first direction, according to an exemplary embodiment of the inventive concept.

FIG. 10 is a plan view illustrating a display apparatus according to an exemplary embodiment of the inventive concept. FIG. 11 is a side view of the display apparatus of FIG. 10 viewed from a first direction, according to an exemplary embodiment of the inventive concept.

Referring to FIGS. 10 and 11, a groove G_1 may be provided in a lower portion of a display apparatus 100_1. The groove G_1 may include a first region A1_1, a second region A2_1, and a third region A3_1, the second region A2_1 may include a first sub-region SA1_1 and a second sub-region SA2_1, and the third region A3_1 may include a third sub-region SA3_1 and a fourth sub-region SA4_1. The first region A1_1 and the first to fourth sub-regions SA1_1-SA4_1 may be similar to the first region A1 and the first to fourth sub-regions SA1-SA4 shown in FIGS. 1 to 3.

However, when viewed in a plan view, each of the first, second, and third regions A1_1, A2_1, and A3_1 may include a lower border and an upper border positioned above the lower border. All of the lower borders of the first, second, and third regions A1_1, A2_1, and A3_1 may be located on the same line that is parallel to the first direction DR1. In other words, each of the lower borders of the first, second, and third regions A1_1, A2_1, and A3_1 may be straight, whereas the lower borders of the second and third regions A2 and A3 in, for example, FIG. 3, may include a slanted portion. Other portions of the groove G_1 may be substantially similar to those of the groove G shown in FIGS. 1 to 3.

Figure 12:
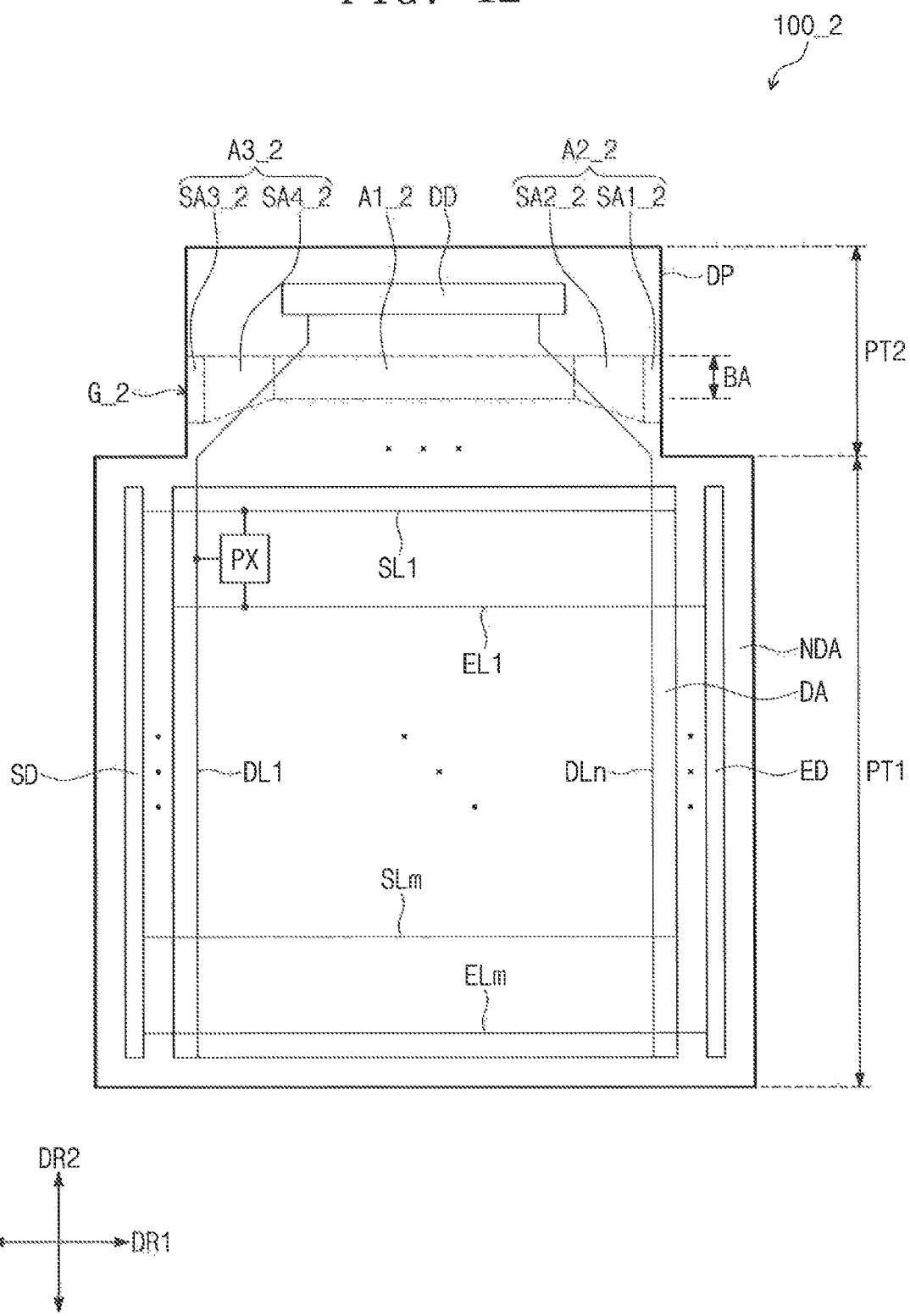
FIG. 12 is a plan view illustrating a display apparatus according to an exemplary embodiment of the inventive concept.
Figure 13:
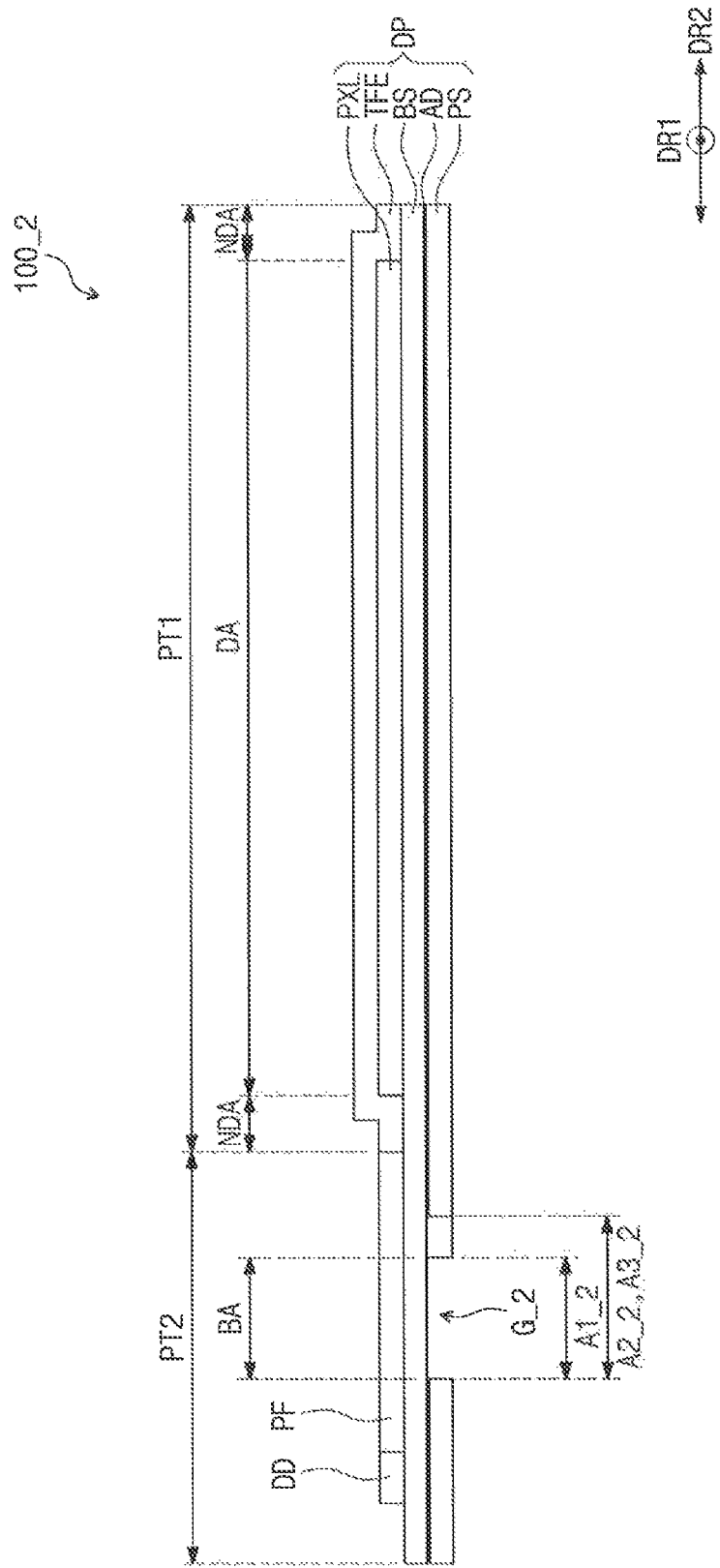
FIG. 13 is a side view of the display apparatus of FIG. 12 viewed from a first direction, according to an exemplary embodiment of the inventive concept.

FIG. 12 is a plan view illustrating a display apparatus according to an exemplary embodiment of the inventive concept. FIG. 13 is a side view of the display apparatus of FIG. 12 viewed from a first direction, according to an exemplary embodiment of the inventive concept.

Referring to FIGS. 12 and 13, a groove G_2 may be provided in a lower portion of a display apparatus 100_2. The groove G_2 may include a first region A1_2, a second region A2_2, and a third region A3_2, the second region A2_2 may include a first sub-region SA1_2 and a second sub-region SA2_2, and the third region A3_2 may include a third sub-region SA3_2 and a fourth sub-region SA4_2. The first region A1_2 and the first to fourth sub-regions SA1_2-SA4_2 may be similar to the first region A1 and the first to fourth sub-regions SA1-SA4 shown in FIGS. 1 to 3.

However, all upper borders of the first, second, and third regions A1_2, A2_2, and A3_2 may be located on the same line that is parallel to the first direction DR1. In other words, each of the upper borders of the first, second, and third regions A1_2, A2_2, and A3_3 may be straight, whereas the upper borders of the second and third regions A2 and A3 in, for example, FIG. 3, may include a slanted portion. Other portions of the groove G_2 may be substantially similar to the groove G shown in FIGS. 1 to 3.

Figure 14:
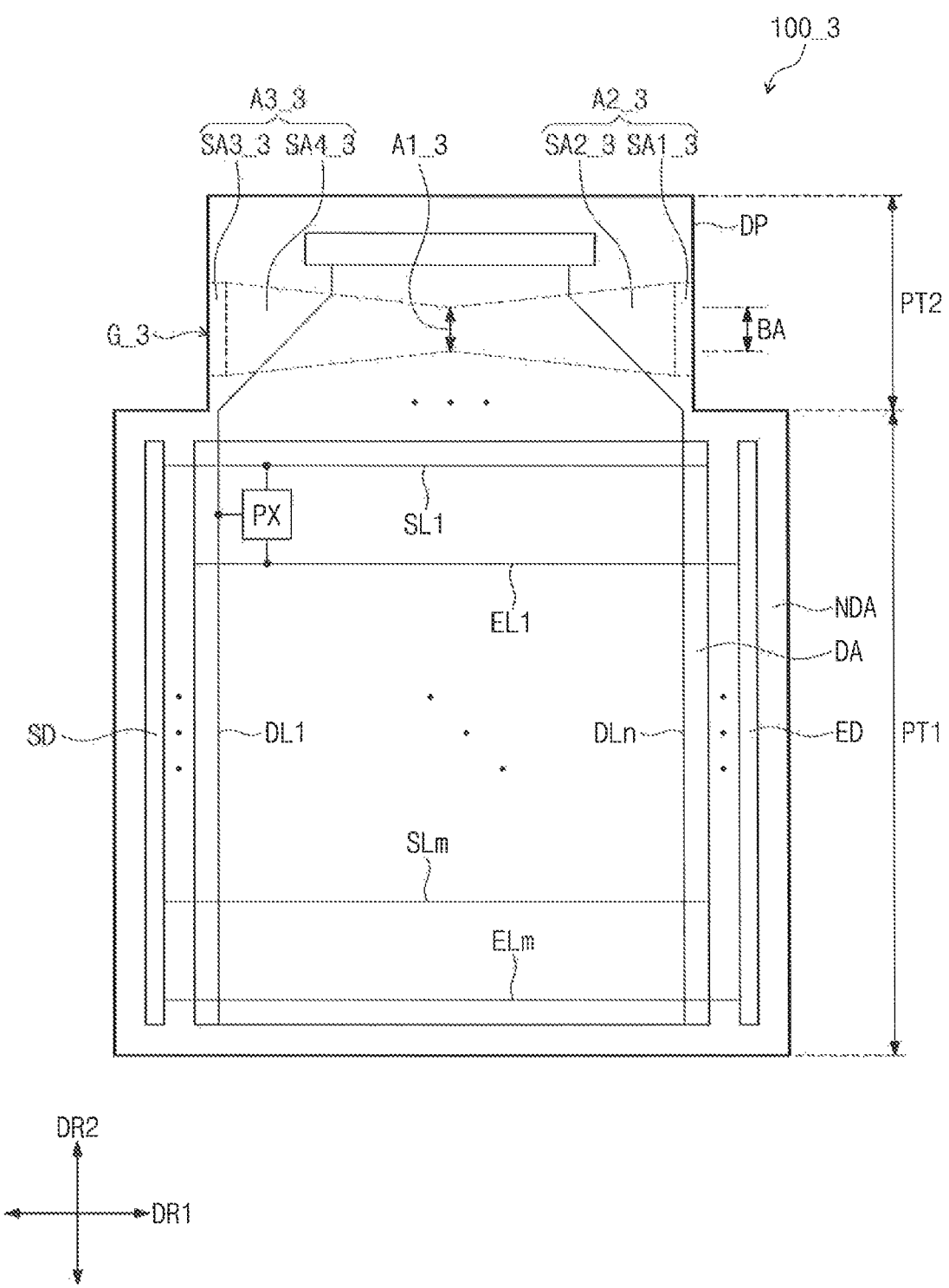
FIG. 14 is a plan view illustrating a display apparatus according to an exemplary embodiment of the inventive concept.
Figure 15:
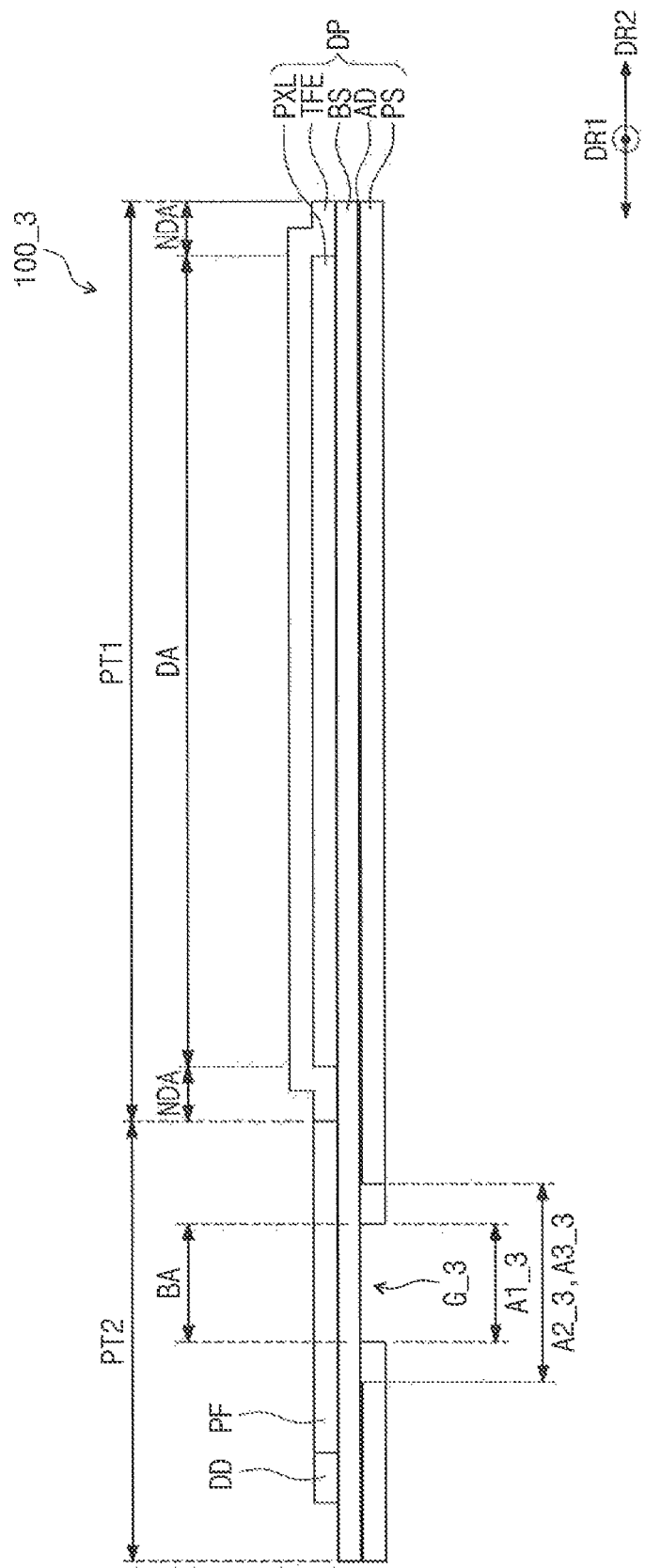
FIG. 15 is a side view of the display apparatus of FIG. 14 viewed from a first direction, according to an exemplary embodiment of the inventive concept.

FIG. 14 is a plan view illustrating a display apparatus according to an exemplary embodiment of the inventive concept. FIG. 15 is a side view of the display apparatus of FIG. 14 viewed from a first direction, according to an exemplary embodiment of the inventive concept.

Referring to FIGS. 14 and 15, a groove G_3 may be provided in a lower portion of a display apparatus 100_3. The groove G_3 may include a first region A1_3, a second region A2_3, and a third region A3_3, the second region A2_3 may include a first sub-region SA1_3 and a second sub-region SA2_3, and the third region A3_3 may include a third sub-region SA3_3 and a fourth sub-region SA4_3. The first region A1_3 and the first to fourth sub-regions SA1_3-SA4_3 may be similar to the first region A1 and the first to fourth sub-regions SA1-SA4.

However, the first region A1_3 may be a central portion of the groove G_3, in the first direction DR1 and the second and fourth sub-regions SA2_3 and SA4_3 may be longer than the second and fourth sub-regions SA2 and SA4 shown in FIGS. 1 to 3, when measured in the first direction DR1. Other portions of the groove G_3 may be substantially similar to those of the groove G shown in FIGS. 1 to 3.

Figure 16:
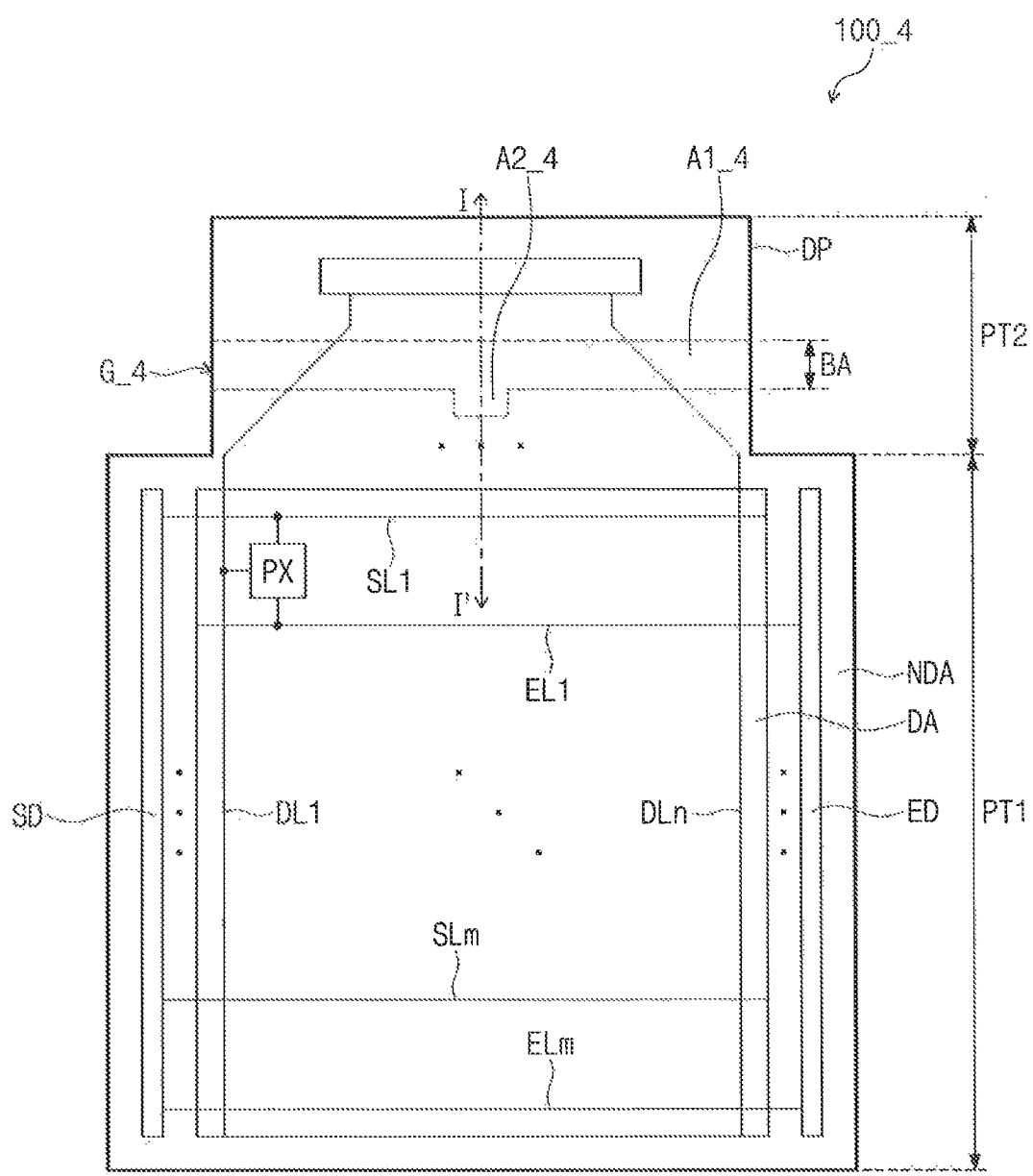
FIG. 16 is a plan view illustrating a display apparatus according to an exemplary embodiment of the inventive concept.
Figure 17:
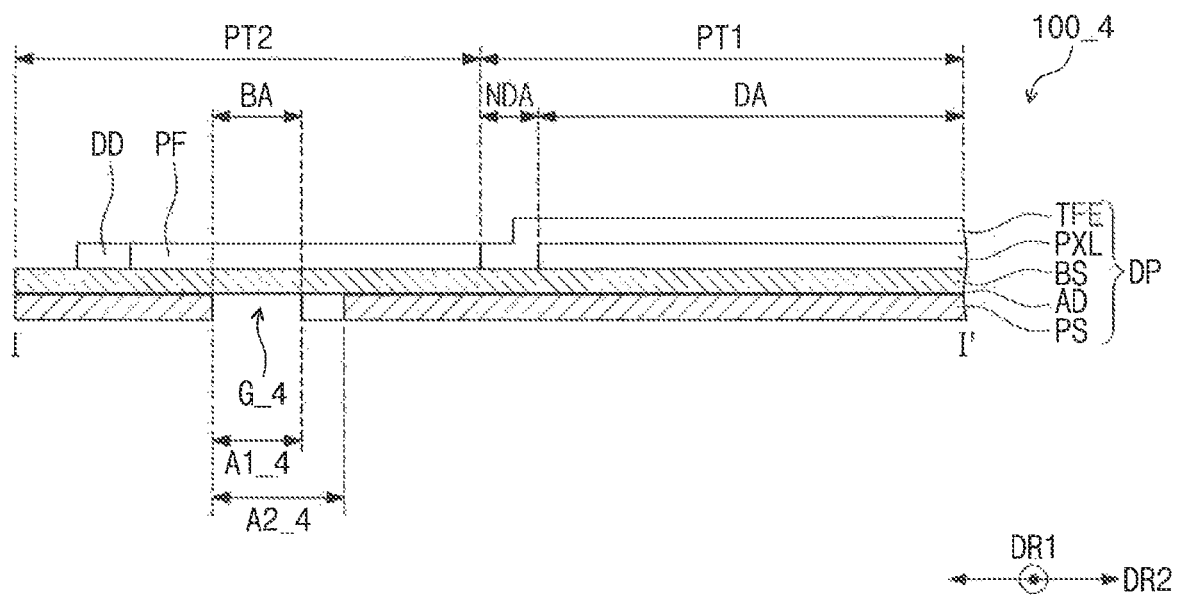
FIG. 17 is a sectional view taken along line I-I' of FIG. 16, according to an exemplary embodiment of the inventive concept.

FIG. 16 is a plan view illustrating a display apparatus according to an exemplary embodiment of the inventive concept. FIG. 17 is a sectional view taken along line I-I' of FIG. 16, according to an exemplary embodiment of the inventive concept.

Referring to FIGS. 16 and 17, a groove G_4 may be provided in a lower portion of a display apparatus 100_4. The groove G_4 may include a first region A1_4 extending in the first direction DR1 and a second region A2_4 extending from a specific portion of the first region A1_4 in the second direction DR2.

For example, the second region A2_4 may be extended from a central portion of the first region A1_4 in the second direction DR2. However, the inventive concept is not limited thereto, and for example, the second region A2_4 may be extended from various other portions of the first region A1_4 in the second direction DR2.

Hereinafter, an upward direction and a downward direction may refer to two opposite directions that are parallel to the second direction DR2. The second region A2_4 may be extended from the central portion of the first region A1_4 in the downward direction. The second region A2_4 may have a tetragonal shape. The bending region BA may be overlapped with the first region A1_4.

Figure 18:
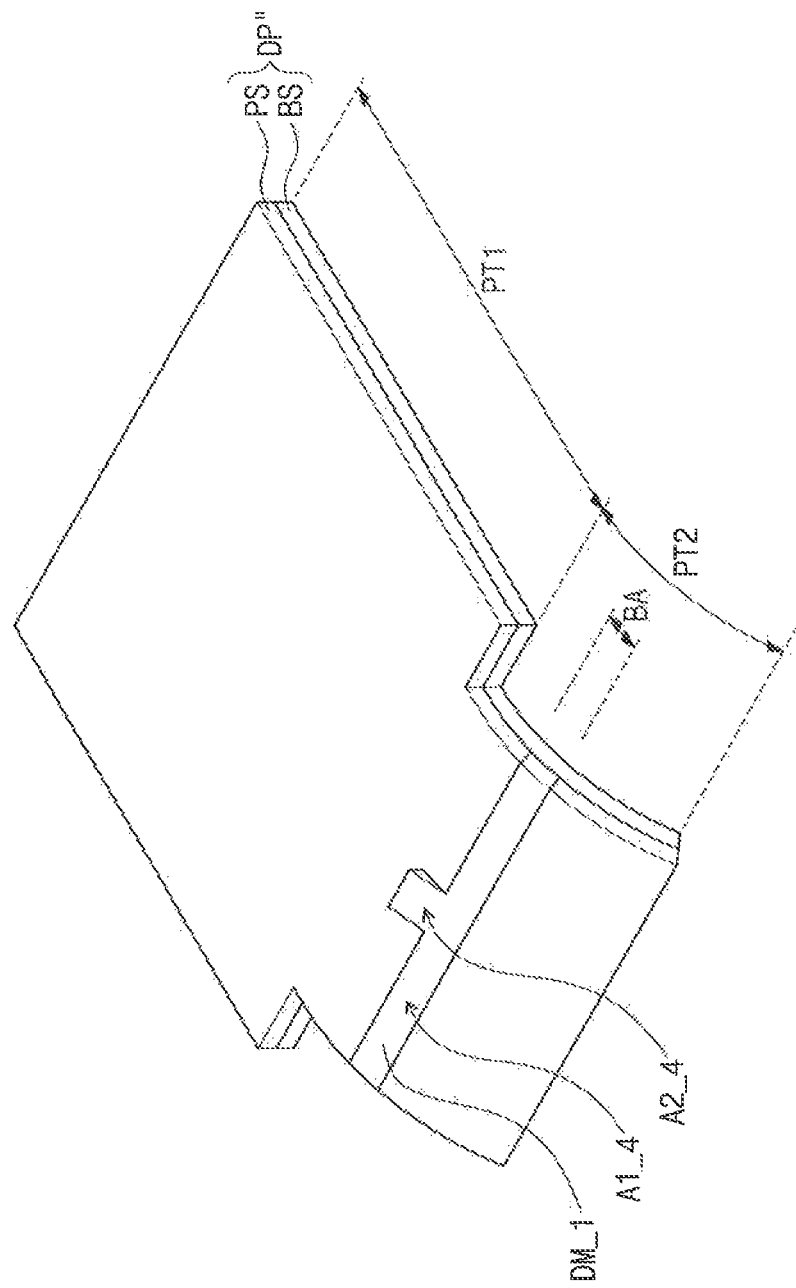
FIGS. 18 and 19 are diagrams illustrating a method of fabricating the display apparatus of FIGS. 16 and 17, according to an exemplary embodiment of the inventive concept.
Figure 19:
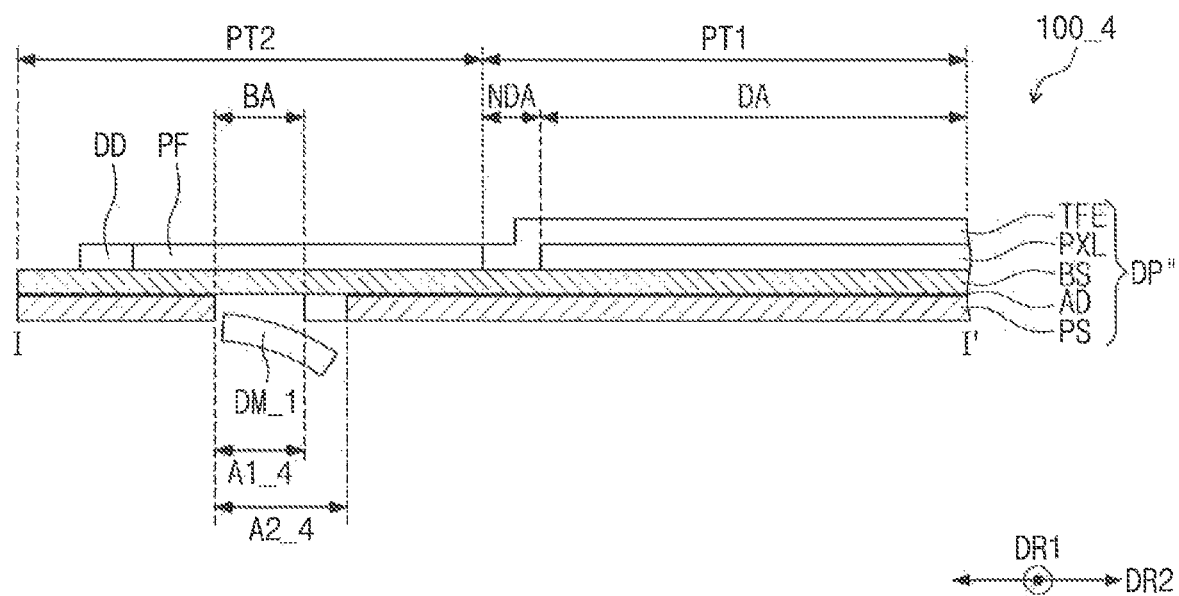

FIGS. 18 and 19 are diagrams illustrating a method of fabricating the display apparatus of FIGS. 16 and 17, according to an exemplary embodiment of the inventive concept.

For convenience in illustration, FIG. 18 illustrates the rear surface of the display panel DP or only the base substrate BS and the protection substrate PS. FIG. 19 illustrates a cross section of the display apparatus 100_4 corresponding to that of FIG. 17.

Referring to FIG. 18, a surface of the base substrate BS facing the protection substrate PS may be the rear surface of the base substrate BS, and a surface, which is opposite to the rear surface of the base substrate BS, may be a top surface of the base substrate BS. A surface of the protection substrate PS facing the rear surface of the base substrate BS may be top surface of the protection substrate PS, and a surface, which is opposite to the top surface of the protection substrate PS, may be a rear surface of the protection substrate PS.

The protection substrate PS may be attached to the rear surface of the base substrate BS by the adhesive member AD. FIGS. 18 and 19 illustrate a display panel DP''', in which the groove G_4 is not yet provided, and a portion of the protection substrate PS overlapped with the groove G_4 shown in FIG. 16 may be a dummy region DM_1. The dummy region DM_1 may include the first region A1_4 and the second region A2_4.

The ultraviolet laser beam UV and the carbon dioxide laser beam $CO2$ may be irradiated to the dummy region DM_1, as described with reference to FIG. 6. After the irradiation of the ultraviolet laser beam UV and the carbon dioxide laser beam $CO2$ to the dummy region DM_1, a bending process may be performed in such a way that, at the bending region BA, the base substrate BS has a concave top surface and the dummy region DM_1 has a convex rear surface. In this case, the second region A2_4 may be preliminarily delaminated. For example, the second region A2_4 may become separated from the base substrate BS.

Referring to FIG. 19, after the preliminary delamination of the second region A2_4, the display panel DP'' may be restored to have a flat shape. For example, a delamination device may be used to grasp the preliminarily delaminated second region A24 and thereby to perform a delamination process on the dummy region DM_1. In other words, the delamination process on the dummy region DM_1 may start from the second region A2_4, when the preliminary delaminated second region A2_4 is grasped by the delamination device. As a result, the groove G_4 may be provided in a lower portion of the display panel DP. Next, the bending region BA may be bent in such a way that the data driver DD is located below the first portion PT1, as described with reference to FIG. 9.

In the process of fabricating the display apparatus 100_4, since the second region A2_4 of the dummy region DM_1 is preliminarily delaminated, and then, the delamination of the second region A2_4 of the dummy region DM_1 starts, it is possible to easily perform the delamination process.

Figure 20:
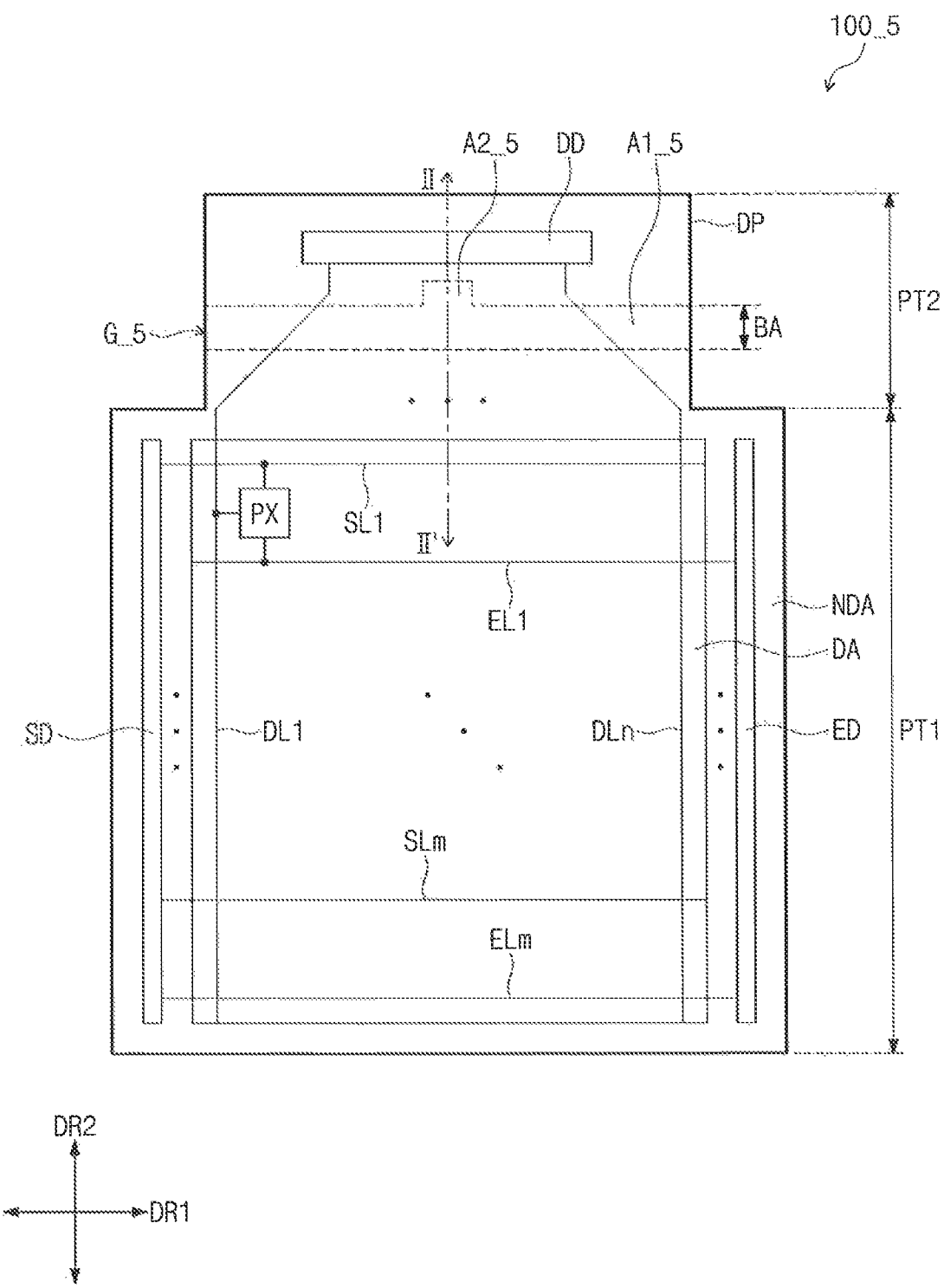
FIG. 20 is a plan view illustrating a display apparatus according to an exemplary embodiment of the inventive concept.
Figure 21:
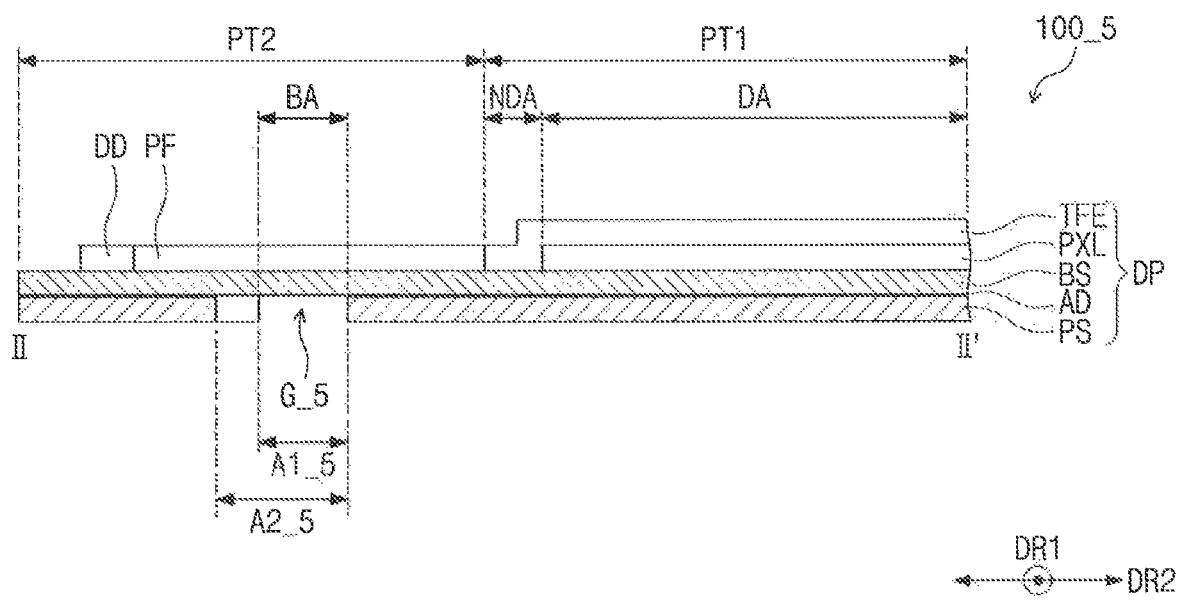
FIG. 21 is a sectional view taken along line II-II' of FIG. 20, according to an exemplary embodiment of the inventive concept.

FIG. 20 is a plan view illustrating a display apparatus according to an exemplary embodiment of the inventive concept. FIG. 21 is a sectional view taken along line II-II' of FIG. 20, according to an exemplary embodiment of the inventive concept.

Referring to FIGS. 20 and 21, a groove G_5 may be provided in a lower portion of a display apparatus 100_5. The groove G_5 may include a first region A1_5 extending in the first direction DR1 and a second region A2_5 extending from a central portion of the first region A1_5 in the upward direction of the second direction DR2.

Except for the difference in the extension direction of the second region A2_5, the groove G_5 may be substantially similar to the groove G_4 shown in FIG. 16. The display apparatus 100_5 may be fabricated by substantially the same method as that for fabricating the display apparatus 100_4 shown in FIGS. 18 and 19. For example, in the process of fabricating the display apparatus 100_5 as shown in FIG. 18, the second region A2_5 of the dummy region DM may be preliminarily delaminated, and then, the dummy region DM may be delaminated to form the groove G_5.

Although FIGS. 16 and 20 illustrate the second region A2_4 or A2_5, which is extended in one of the upward and downward directions, the inventive concept is not limited thereto. For example, the second region A2_4 or A2_5 may be extended in both of the upward and downward directions.

Figure 22:
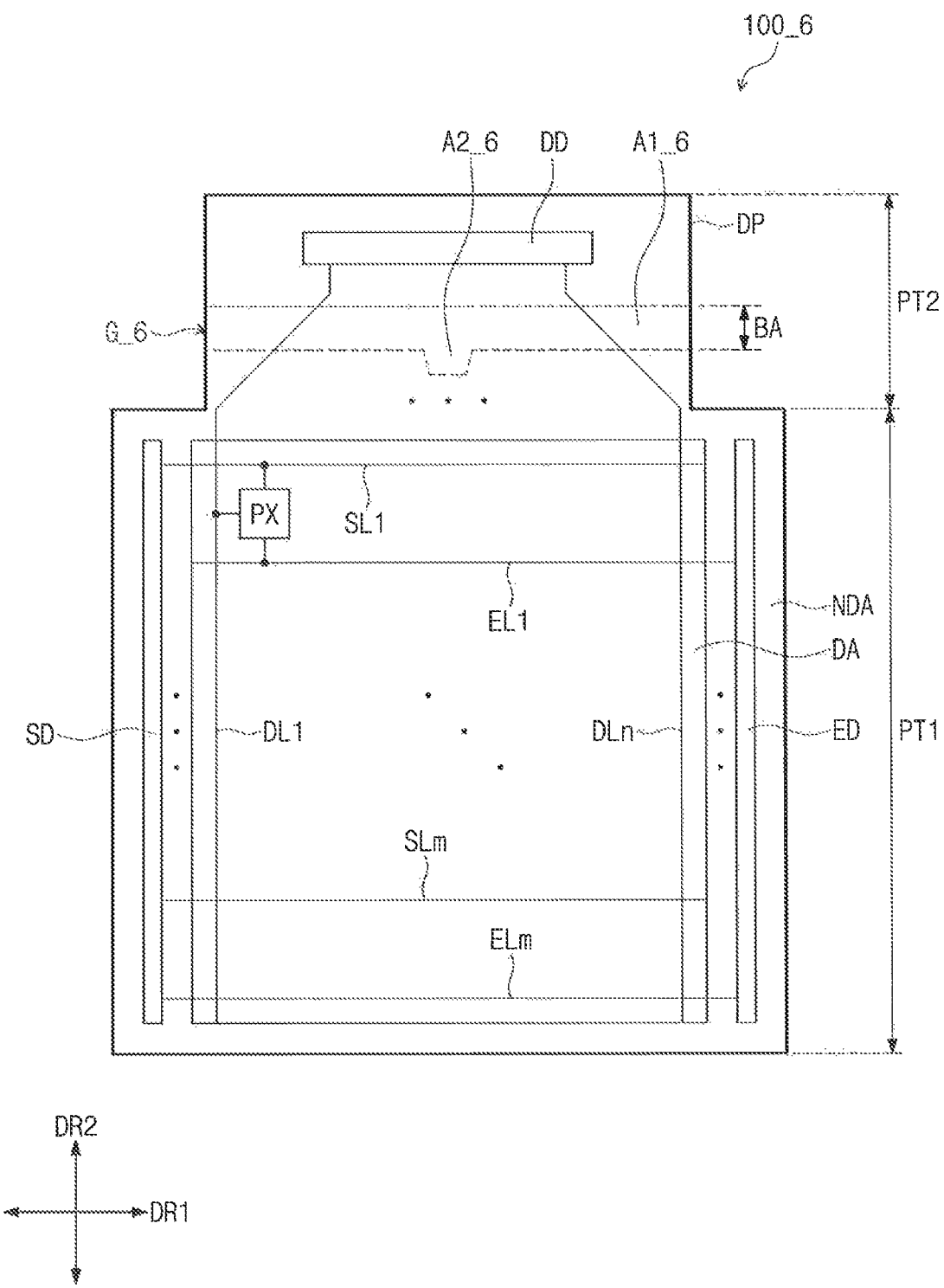
FIG. 22 is a plan view illustrating a display apparatus according to an exemplary embodiment of the inventive concept.

FIG. 22 is a plan view illustrating a display apparatus according to an exemplary embodiment of the inventive concept.

Since a structure of a groove G in a rear surface of a display panel DP is easily seen from a plan view of the display apparatus 100, each of the following display apparatuses 100_6-100_14 will be described without its side and sectional views.

Referring to FIG. 22, a groove G_6 may be provided in a lower portion of a display apparatus 100_6, and for example, the groove G_6 may include a first region A1_6 and a second region A2_6. The second region A2_6 may have a trapezoidal shape and may be extended from a central portion of the first region A1_6 in the downward direction. Two opposite sides of the second region A2_6 having the trapezoidal shape may be in contact with the first region A1_6. Except for the difference in the shape of the second region A2_6, the groove G_6 may be substantially similar to the groove G_4 shown in FIG. 16.

Figure 23:
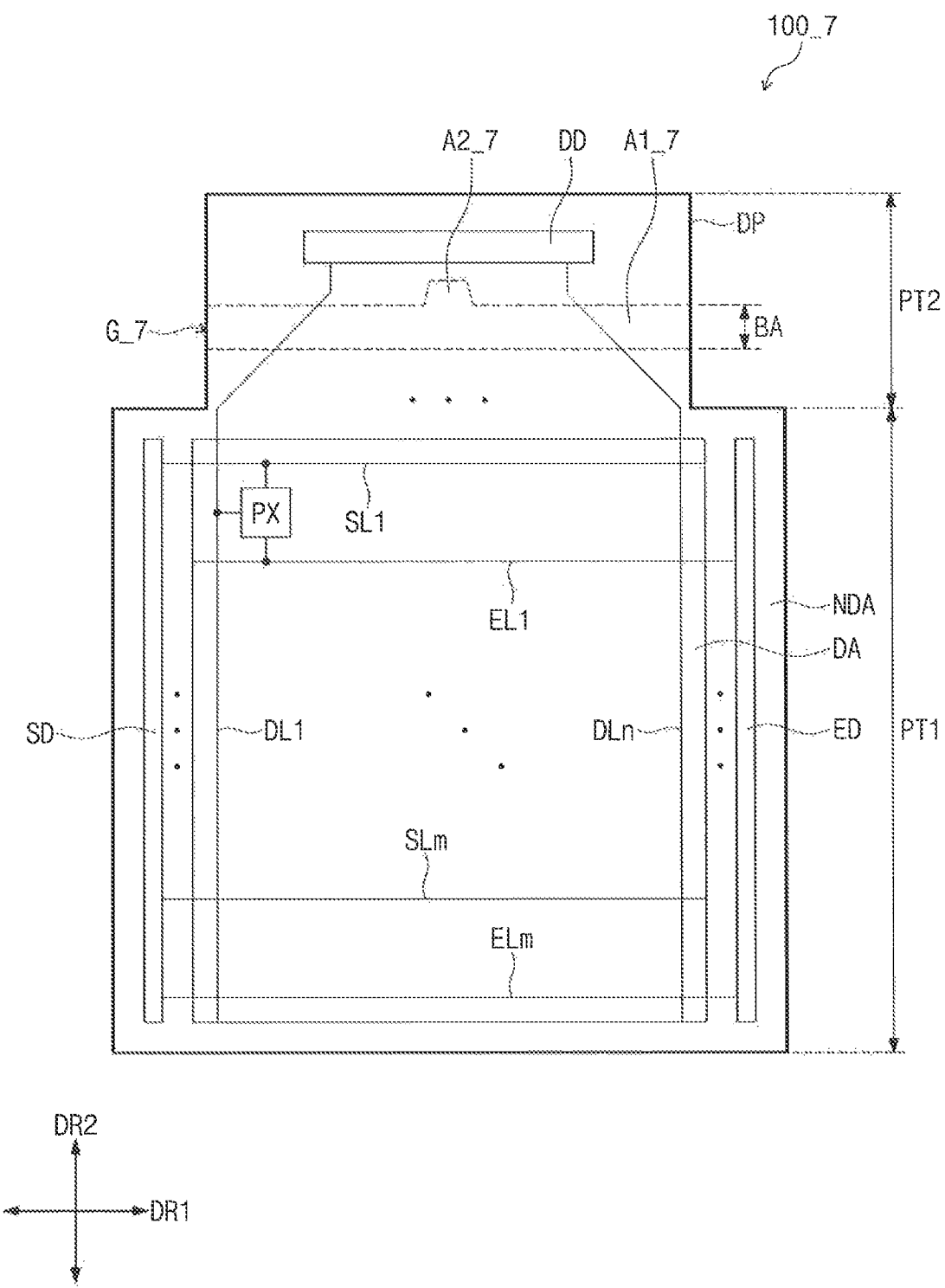
FIG. 23 is a plan view illustrating a display apparatus according to an exemplary embodiment of the inventive concept.

FIG. 23 is a plan view illustrating a display apparatus according to an exemplary embodiment of the inventive concept.

Referring to FIG. 23, a groove G_7 may be provided in a lower portion of a display apparatus 100_7, and for example, the groove G_7 may include a first region A1_7 and a second region A2.7. The second region A2_7 may have a trapezoidal shape and may be extended from a central portion of the first region A1_7 in the upward direction. Except for the difference in the shape of the second region A2_7, the groove G_7 may be substantially similar to the groove G_5 shown in FIG. 20.

Figure 24:
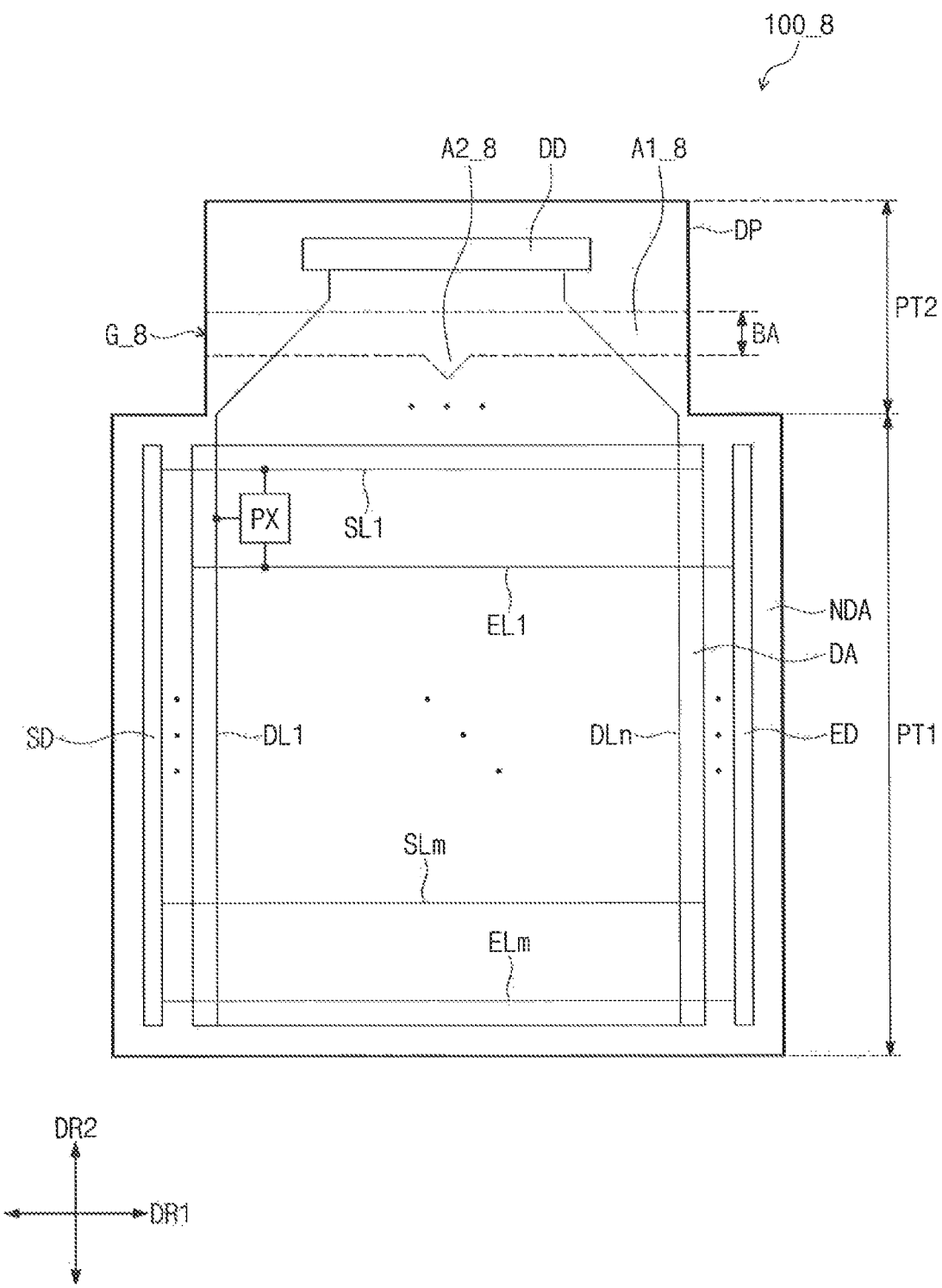
FIG. 24 is a plan view illustrating a display apparatus according to an exemplary embodiment of the inventive concept.

FIG. 24 is a plan view illustrating a display apparatus according to an exemplary embodiment of the inventive concept.

Referring to FIG. 24, a groove G_8 may be provided in a lower portion of a display apparatus 100_8, and for example, the groove G_8 may include a first region A1_8 and a second region A2_8. The second region A2_8 may have a triangular shape and may be extended from a central portion of the first region A1_8 in the downward direction. Except for the difference in the shape of the second region A2_8, the groove G_8 may be substantially similar to the groove G_4 shown in FIG. 16.

Figure 25:
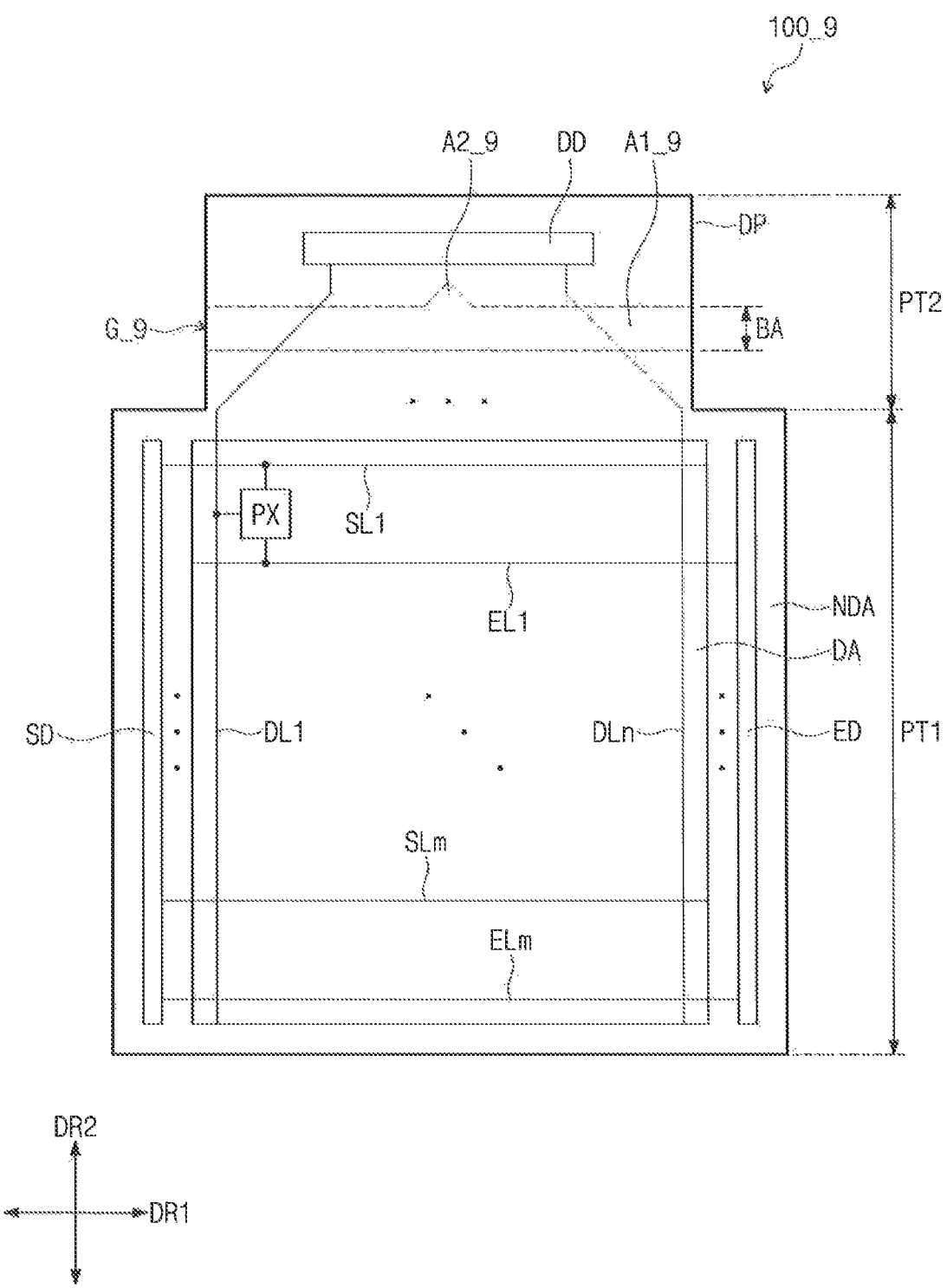
FIG. 25 is a plan view illustrating a display apparatus according to an exemplary embodiment of the inventive concept.

FIG. 25 is a plan view illustrating a display apparatus according to an exemplary embodiment of the inventive concept.

Referring to FIG. 25, a groove G_9 may be provided in a lower portion of a display apparatus 100_9, and for example, the groove G_9 may include a first region A1_9 and a second region A2_9. The second region A2_9 may have a triangular shape and may be extended from a central portion of the first region A1_9 in the upward direction. Except for the difference in the shape of the second region A2_9, the groove G_9 may be substantially similar to the groove G_5 shown in FIG. 20.

Figure 26:
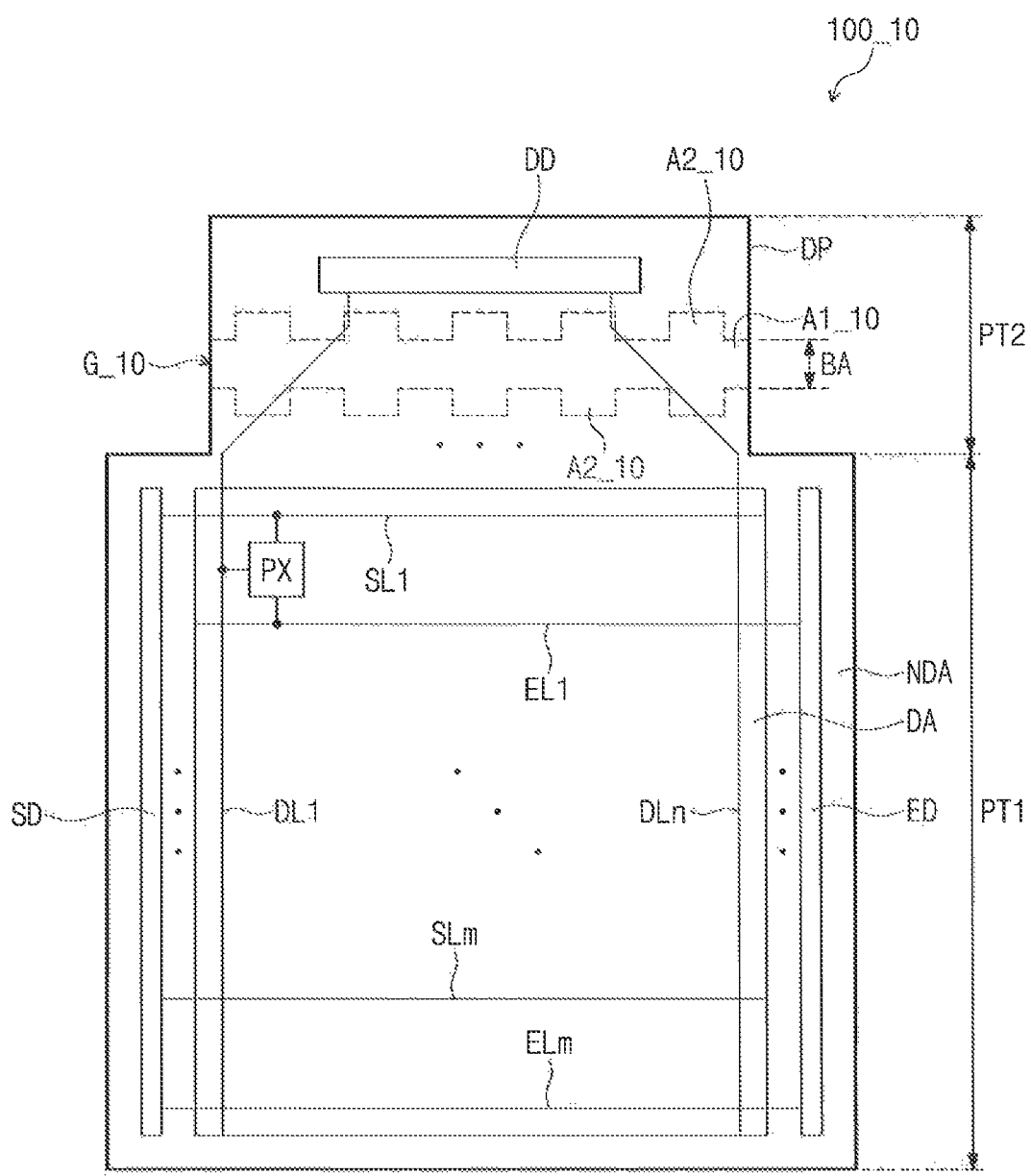
FIG. 26 is a plan view illustrating a display apparatus according to an exemplary embodiment of the inventive concept.

FIG. 26 is a plan view illustrating a display apparatus according to an exemplary embodiment of the inventive concept.

Referring to FIG. 26, a groove G_10 may be provided in a lower portion of a display apparatus 100_10, and for example, the groove G_10 may include a first region A1_10 extending in the first direction DR1 and a plurality of second regions A2_10 extending from specific portions of the first region A1_10 in the second direction DR2. The second regions A2_10 may have a tetragonal shape and may be extended from the first region A1_10 in the upward and downward directions. The second regions A2_10 may be spaced apart from each other in the first direction DR1.

In the process of fabricating the display apparatus 100_10, the second region A2_10 of the dummy region DM may be preliminarily delaminated, and then, the dummy region DM may be delaminated to form the groove G_10.

Figure 27:
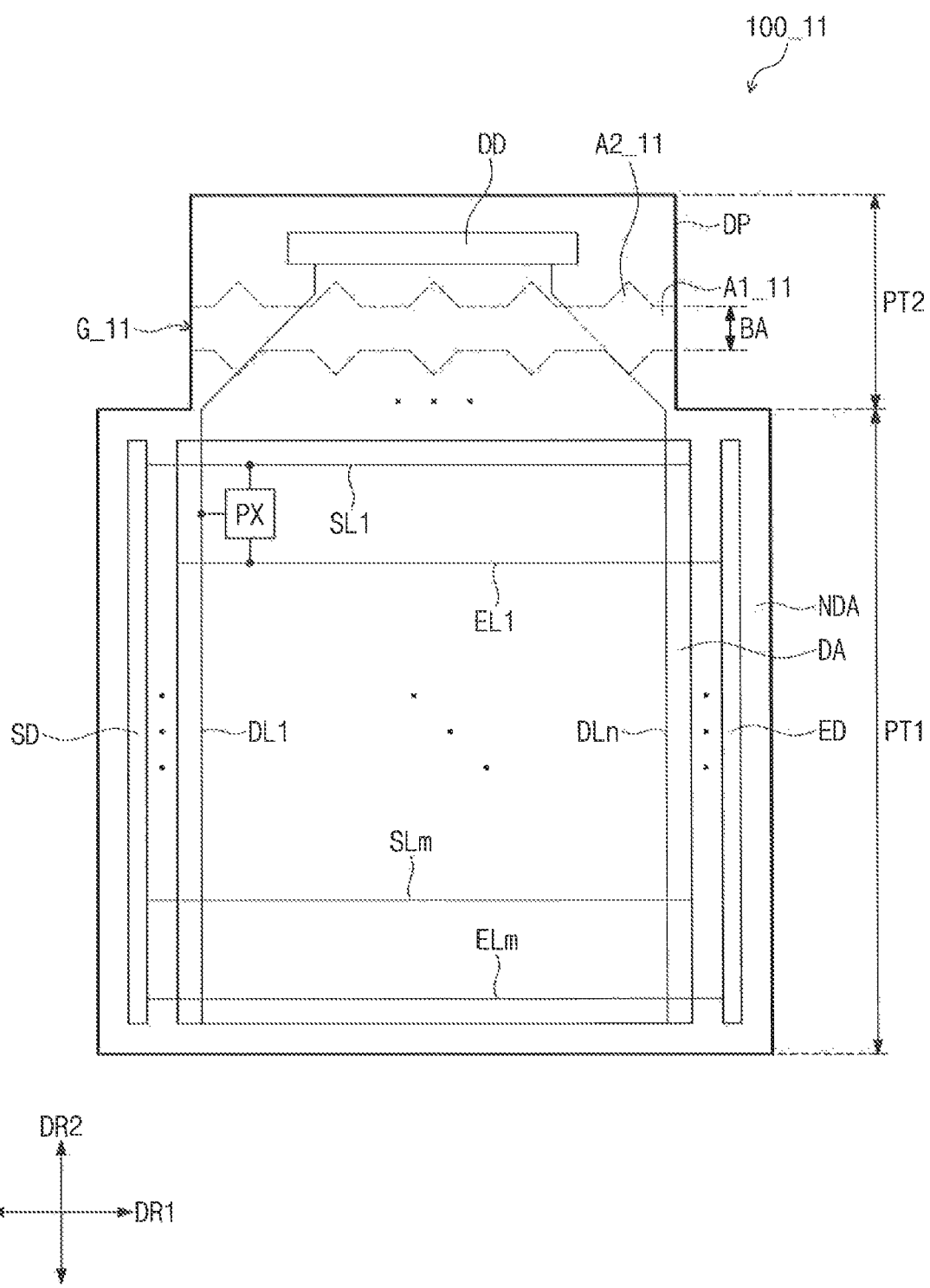
FIG. 27 is a plan view illustrating a display apparatus according to an exemplary embodiment of the inventive concept.

FIG. 27 is a plan view illustrating a display apparatus according to an exemplary embodiment of the inventive concept.

Referring to FIG. 27, a groove G_11 may be provided in a lower portion of a display apparatus 100_11, and for example, the groove G_11 may include a first region A1_11 and a plurality of second regions A2_11, each of which has a triangular shape. Except for the difference in the shape of the second regions A2_11, the groove G_11 may be substantially similar to the groove G_10 shown in FIG. 26.

Figure 28:
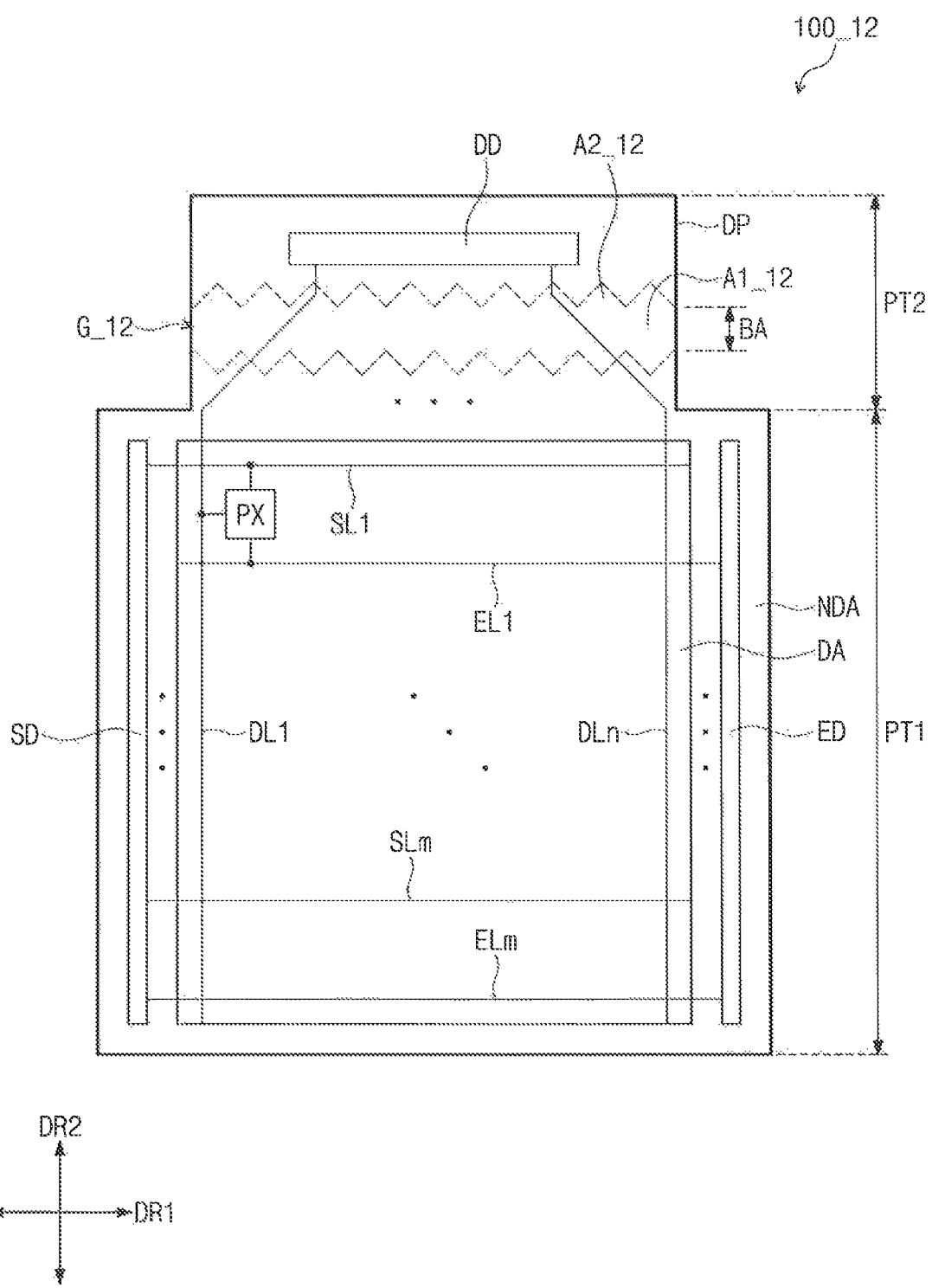
FIG. 28 is a plan view illustrating a display apparatus according to an exemplary embodiment of the inventive concept.

FIG. 28 is a plan view illustrating a display apparatus according to an exemplary embodiment of the inventive concept.

Referring to FIG. 28, a groove G_12 may be provided in a lower portion of a display apparatus 100_12, and for example, the groove G_12 may include a first region A1_12 and a plurality of second regions A2_12. Each of the second regions A2_12 may have a triangular shape whose one side is in contact with the first region A1_12. Adjacent second regions A2_12 may be in contact with each other. For example, sides of adjacent second regions A2_12 may be in contact with each other. Other portions of the groove G_12 may be substantially similar to the groove G_11 shown in FIG. 27.

Figure 29:
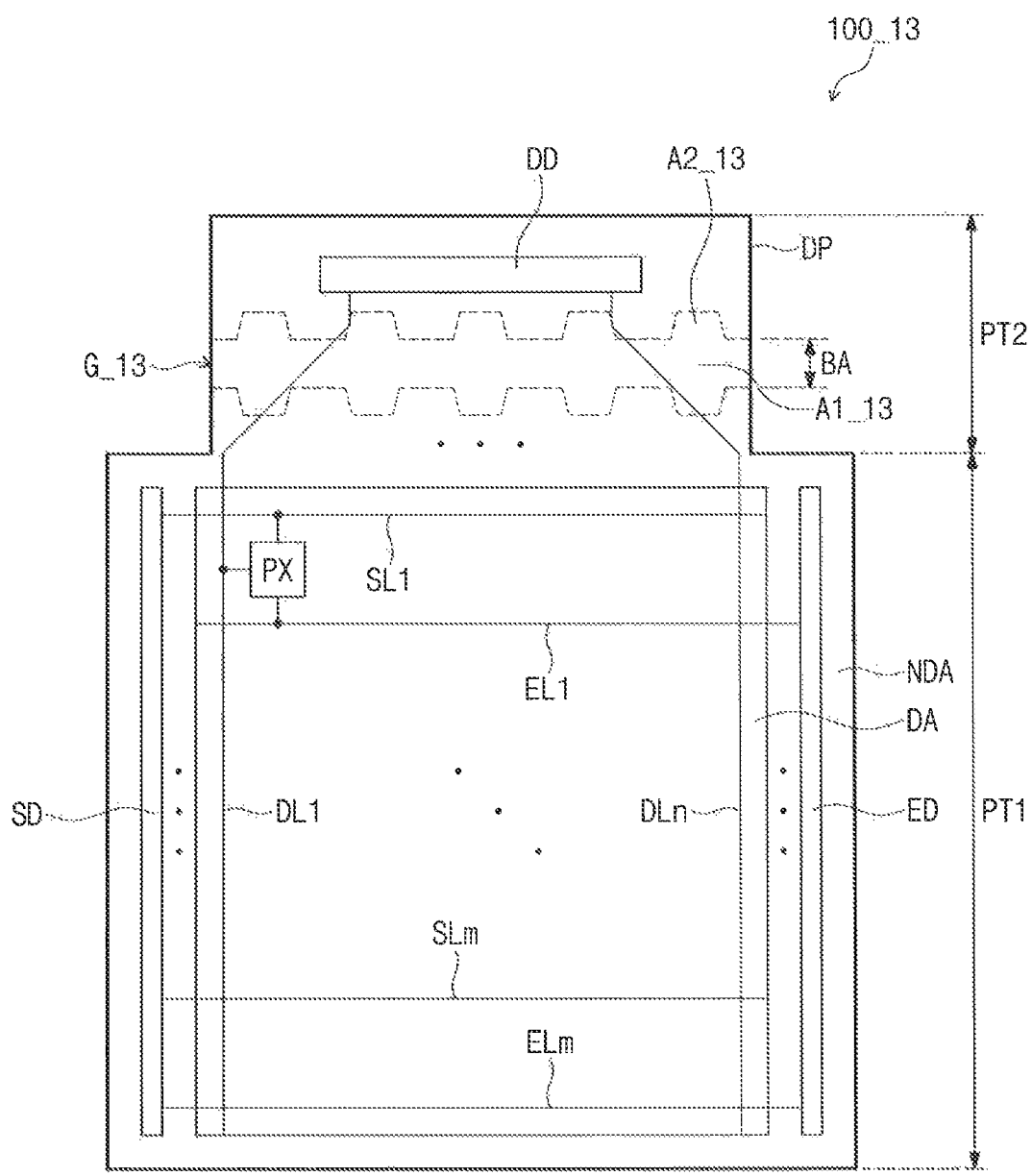
FIG. 29 is a plan view illustrating a display apparatus according to an exemplary embodiment of the inventive concept.

FIG. 29 is a plan view illustrating a display apparatus according to an exemplary embodiment of the inventive concept.

Referring to FIG. 29, a groove G_13 may be provided in a lower portion of a display apparatus 100_13, and for example, the groove G_13 may include a first region A1_13 and a plurality of second regions A2_13, each of which has a trapezoidal shape. Two opposite sides of each of the second regions A2_13 on both sides of the first region A1_13 may be in contact with the first region A1_13. Except for the difference in the shape of the second regions A2_13, the groove G_13 may be substantially similar to the groove G_10 shown in FIG. 26.

Figure 30:
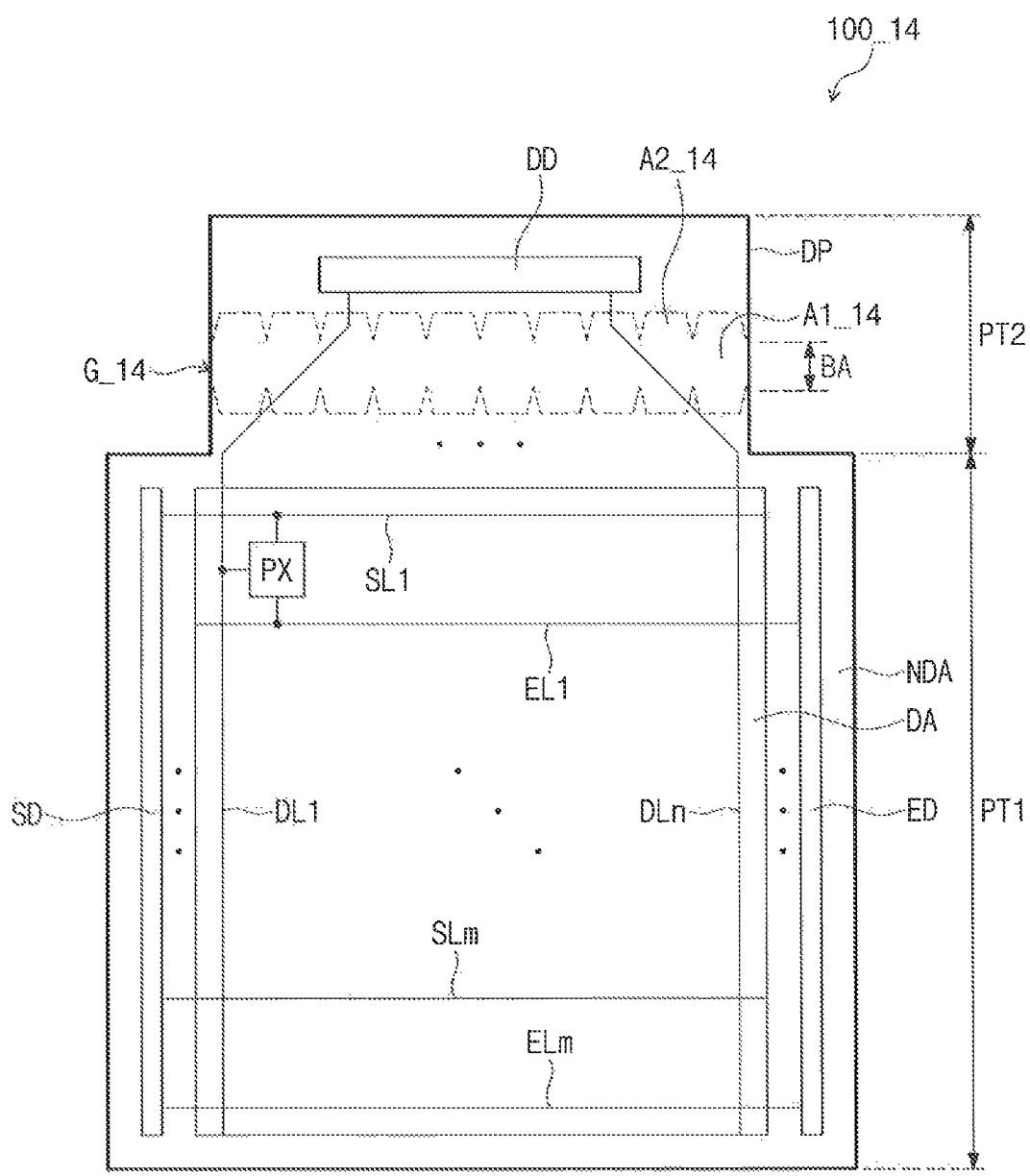
FIG. 30 is a plan view illustrating a display apparatus according to an exemplary embodiment of the inventive concept.

FIG. 30 is a plan view illustrating a display apparatus according to an exemplary embodiment of the inventive concept.

Referring to FIG. 30, a groove G_14 may be provided in a lower portion of a display apparatus 100_14, and for example, the groove G_14 may include a first region A1_14 and a plurality of second regions A2_14, each of which has a trapezoidal shape. Two opposite sides of each of the second regions A2_14 on both sides of the first region A1_14 may be in contact with the first region A1_14. Adjacent second regions A2_14 may be in contact with each other. For example, the adjacent second regions A2_14 may be provided in such a way that ends of their sides are in contact with each other. The groove G_14 may be substantially similar to the groove G_13 shown in FIG. 29.

According to an exemplary embodiment of the inventive concept, a dummy region DM of a protection substrate PS may be formed in such a way that each of two side regions of the dummy region DM has a large width. Therefore, a delamination operation may be more easily performed on the dummy region DM. In addition, when a groove G is formed by removing the dummy region DM, the groove G may be formed to have side regions, whose borders are spaced apart from a bending region BA of a display panel DP. Accordingly, it is possible to relieve a strain and a stress to be exerted on the borders of the side regions of the bending region BA.

While the inventive concept has been particularly shown and described with reference to exemplary embodiments thereof, it will be understood by one of ordinary skill in the art that variations in form and detail may be made thereto without departing from the spirit and scope of the inventive concept as defined by the attached claims.

What is claimed is:
1. A display apparatus, comprising:
  a base substrate including a first portion and a second portion smaller than the first portion;
  a plurality of pixels disposed on the first portion;

a protection substrate disposed below the base substrate; and a groove disposed in a portion of the protection substrate and overlapped with the second portion, wherein the groove comprises:

a first region extending in a first direction; and a second region and a third region, which are arranged along the first direction, wherein the first region is interposed between the second region and the third region along the first direction, the first and second portions are arranged in a second direction crossing the first direction when the display apparatus is in an unbent state, and a width of each of the second and third regions is larger than a first width of the first region, when measured in the second direction.

2. The display apparatus of claim 1, wherein the second region and the third region have symmetric shapes.

3. The display apparatus of claim 1, wherein the second region comprises:

a first sub-region having a second width larger than the first width; and a second sub-region between the first region and the first sub-region, wherein the third region comprises:

a third sub-region having a third width larger than the first width; and a fourth sub-region between the first region and the third sub-region.

4. The display apparatus of claim 3, wherein the second width is substantially equal to the third width.

5. The display apparatus of claim 3, wherein the second width is different from the third width.

6. The display apparatus of claim 3, wherein the second sub-region gradually decreases in width from the second width to the first width as the second sub-region gets closer to the first region.

7. The display apparatus of claim 3, wherein the fourth sub-region gradually decreases in width from the third width to the first width as the fourth sub-region gets closer to the first region.

8. The display apparatus of claim 1, wherein the second portion comprises a bending region, which is overlapped with the first region, a region of the second region and a region of the third region, wherein the bending region has the first width and is extended in the first direction.

9. The display apparatus of claim 8, wherein the first portion comprises:

a display region provided with the pixels; and a non-display region adjacent to the display region.

10. The display apparatus of claim 9, further comprising:

a scan driver, which is provided on the non-display region and is connected to the pixels through a plurality of scan lines;

an emission driver, which is provided on the nota-display region and is connected to the pixels through a plurality of emission lines; and a data driver, which is provided on the second portion and is connected to the pixels through a plurality of data lines, wherein the bending region is disposed between the data driver and the first portion.

11. The display apparatus of claim 10, wherein when the bending region is bent, the data driver is disposed below the first portion.

12. The display apparatus of claim 1, further comprising a thin encapsulation layer, which is disposed on the first portion and covers the pixels.

13. The display apparatus of claim 1, wherein a lower border of the first region, a lower border of the second region, and a lower border of the third region are located on a same line that is parallel to the first direction.

14. The display apparatus of claim 1, wherein an upper border of the first region, an upper border of the second region, and an upper border of the third region are located on a same line that is parallel to the first direction.

15. The display apparatus of claim 1, wherein the first region is central portion of the groove.

16. A display apparatus, comprising:

a base substrate having a bending region in a non-display area;

a protection substrate disposed on the base substrate;

a groove disposed in the bending region and having a bottom that is formed by a surface of the base substrate, wherein the groove is formed in the protection substrate, wherein the protection substrate is separated by a first side of the groove and a second side of the groove, wherein the first and second sides of the groove are opposite each other, and wherein a width of a first portion of the bottom of the groove measured between the first and second sides of the groove is greater than a width of a second portion of the bottom of the groove measured between the first and second sides of the groove.

17. The display apparatus of claim 16, wherein a width of a third portion of the bottom of the groove measured between the first and second sides of the groove is greater than the width of the second portion of the bottom of the groove.

18. The display apparatus of claim 17, wherein the second portion of the bottom of the groove is disposed between the first and third portions of the bottom of the groove.

19. The display apparatus of claim 17, wherein the width of the first portion of the bottom of the groove is different from the width of the third portion of the bottom of the groove.

20. The display apparatus of claim 17, wherein the width of the first portion of the bottom of the groove is substantially equal to the width of the third portion of the bottom of the groove.

* * * * *